US008687414B2

(12) United States Patent
Nagahara et al.

(10) Patent No.: US 8,687,414 B2
(45) Date of Patent: Apr. 1, 2014

(54) MAGNETIC MEMORY ELEMENT AND MAGNETIC RANDOM ACCESS MEMORY

(75) Inventors: Kiyokazu Nagahara, Tokyo (JP); Shunsuke Fukami, Tokyo (JP); Nobuyuki Ishiwata, Tokyo (JP); Tetsuhiro Suzuki, Tokyo (JP); Norikazu Ohshima, Tokyo (JP)

(73) Assignee: NEC Corporation, Tokyo (JP)

( * ) Notice: Subject to any disclaimer, the term of this patent is extended or adjusted under 35 U.S.C. 154(b) by 137 days.

(21) Appl. No.: 13/139,607

(22) PCT Filed: Dec. 24, 2009

(86) PCT No.: PCT/JP2009/071408
§ 371 (c)(1),
(2), (4) Date: Jul. 19, 2011

(87) PCT Pub. No.: WO2010/074130
PCT Pub. Date: Jul. 1, 2010

(65) Prior Publication Data
US 2011/0267879 A1    Nov. 3, 2011

(30) Foreign Application Priority Data

Dec. 25, 2008   (JP) .................................. 2008-330507
Oct. 1, 2009    (JP) .................................. 2009-229644

(51) Int. Cl.
*G11C 11/14*      (2006.01)
(52) U.S. Cl.
USPC ............. 365/171; 365/157; 365/158; 365/80; 365/87; 365/88; 257/E21.665; 257/E29.323

(58) Field of Classification Search
USPC ....................... 365/171, 157, 158, 80, 87, 88; 257/E21.665, E29.323
See application file for complete search history.

(56) References Cited

U.S. PATENT DOCUMENTS

| 6,834,005 | B1 | 12/2004 | Parkin |
| 7,738,278 | B2* | 6/2010 | Kim et al. ........................ 365/80 |
| 7,869,266 | B2 | 1/2011 | Ranjan et al. |
| 7,952,906 | B2* | 5/2011 | Lim ................................ 365/81 |
| 2005/0078509 | A1 | 4/2005 | Parkin |
| 2007/0195588 | A1 | 8/2007 | Kim et al. |
| 2007/0217256 | A1* | 9/2007 | Ono ............................ 365/171 |
| 2008/0068880 | A1 | 3/2008 | Lim et al. |
| 2008/0137395 | A1 | 6/2008 | Hwang et al. |

(Continued)

FOREIGN PATENT DOCUMENTS

| JP | 2004-253739 A | 9/2004 |
| JP | 2005093488 A | 4/2005 |

(Continued)

OTHER PUBLICATIONS

International Search Report for PCT/JP2009/071408 mailed Mar. 9, 2010.

(Continued)

*Primary Examiner* — Toan Le
(74) *Attorney, Agent, or Firm* — Sughrue Mion, PLLC

(57) ABSTRACT

A magnetic memory cell includes: a magnetization recording layer; and a magnetic tunneling junction section. The magnetization recording layer includes a ferromagnetic layer with perpendicular magnetic anisotropy. The magnetic tunneling junction section is used for reading information in the magnetization recording layer. The magnetization recording layer includes two domain wall moving areas.

18 Claims, 22 Drawing Sheets

(56) References Cited

U.S. PATENT DOCUMENTS

| | | |
|---|---|---|
| 2008/0138659 A1 | 6/2008 | Lim et al. |
| 2008/0152954 A1 | 6/2008 | Lim |
| 2009/0185312 A1 | 7/2009 | Cho et al. |
| 2009/0207643 A1* | 8/2009 | Joe et al. .................. 365/85 |
| 2011/0026273 A1 | 2/2011 | Bourdelas et al. |
| 2011/0260273 A1 | 10/2011 | Fukami et al. |

FOREIGN PATENT DOCUMENTS

| | | |
|---|---|---|
| JP | 2005191032 A | 7/2005 |
| JP | 2005-529486 A | 9/2005 |
| JP | 2005535111 A | 11/2005 |
| JP | 2006073930 A | 3/2006 |
| JP | 2007288162 A | 11/2007 |
| JP | 2008078650 A | 4/2008 |
| WO | 2007020823 A | 2/2007 |
| WO | 2007119446 A | 10/2007 |
| WO | 2008047536 A | 4/2008 |
| WO | 2008108108 A | 9/2008 |

OTHER PUBLICATIONS

N. Sakimura et al., "A 250-MHz 1-Mbit Embedded MRAM Macro Using 2T1 MTJ Cell with Bitline Separation and Half-Pitch Shift Architecture". IEEE Asian Solid-State Circuits Conference, ASSCC'07, Nov. 2007, pp. 216-219.

N. Sakimura et al., "MRAM Cell Technology for Over 500-MHz SoC", IEEE Journal of Solid-State Circuits, vol. 42, No. 4, Apr. 2007, pp. 830-836.

J. C. Slonczewski, "Current-driven excitation of magnetic multilayers". Journal of Magnetism & Magnetic Materials, 159, 1996, pp. L1-L7.

A. Yamaguch et al., "Real Space Observation of Current-Driven Domain Wall Motion in Submicron Magnetic Wires", Physical Review Letters, vol. 92, No. 7, Feb. 20, 2004, pp. 077205-1-007205-4.

A. Yamaguchi et al., "Reduction of Threshold Current Density for Current-Driven Domain Wall Motion using Shape Control", Japanese Journal of Applied Physics, vol. 45, No. 5A, 2006, pp. 3850-3853.

S. Fukami et al., "Micromagnetic analysis of current driven domain wall motion in nanostrips with perpendicular magnetic anisotropy", Journal of Applied Physics, vol. 103. 2008, 07E718-1-07E718-3

D. Ravelosona et al. "Threshold currents to move domain wall in films with perpendicular anisotropy", Applied Physics Letters, vol. 90, 2007, 072508-1-072508-3.

US Office Action for U.S. Appl. No. 13/139,604 dated on Mar. 15, 2013.

Japanese Office Action for JP Application No. 2010-544115 mailed on Oct. 1, 2013 with English Translation.

* cited by examiner

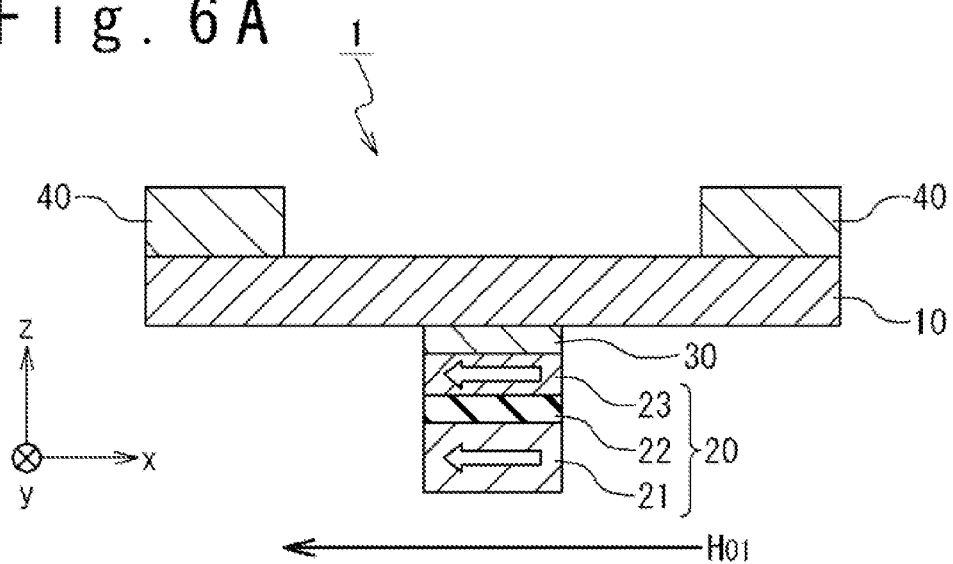
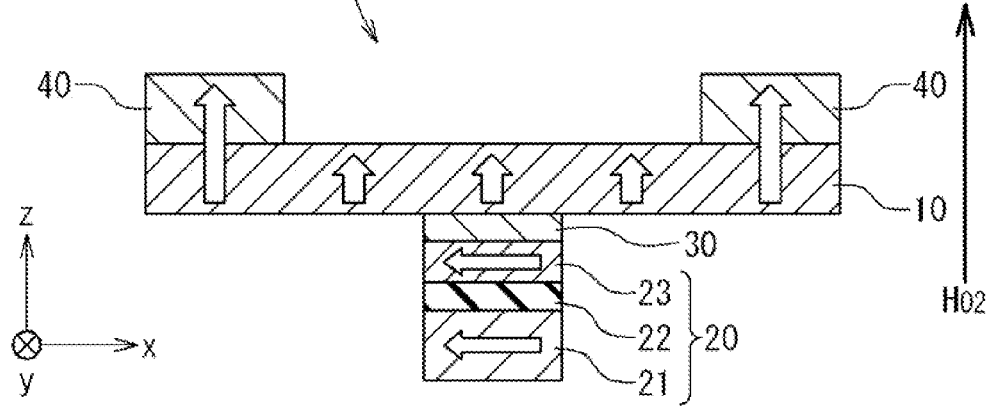
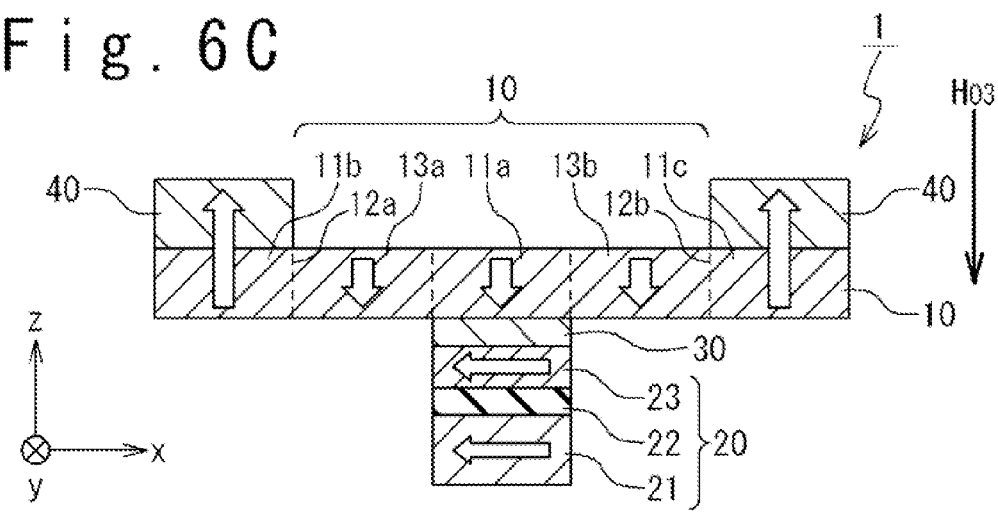

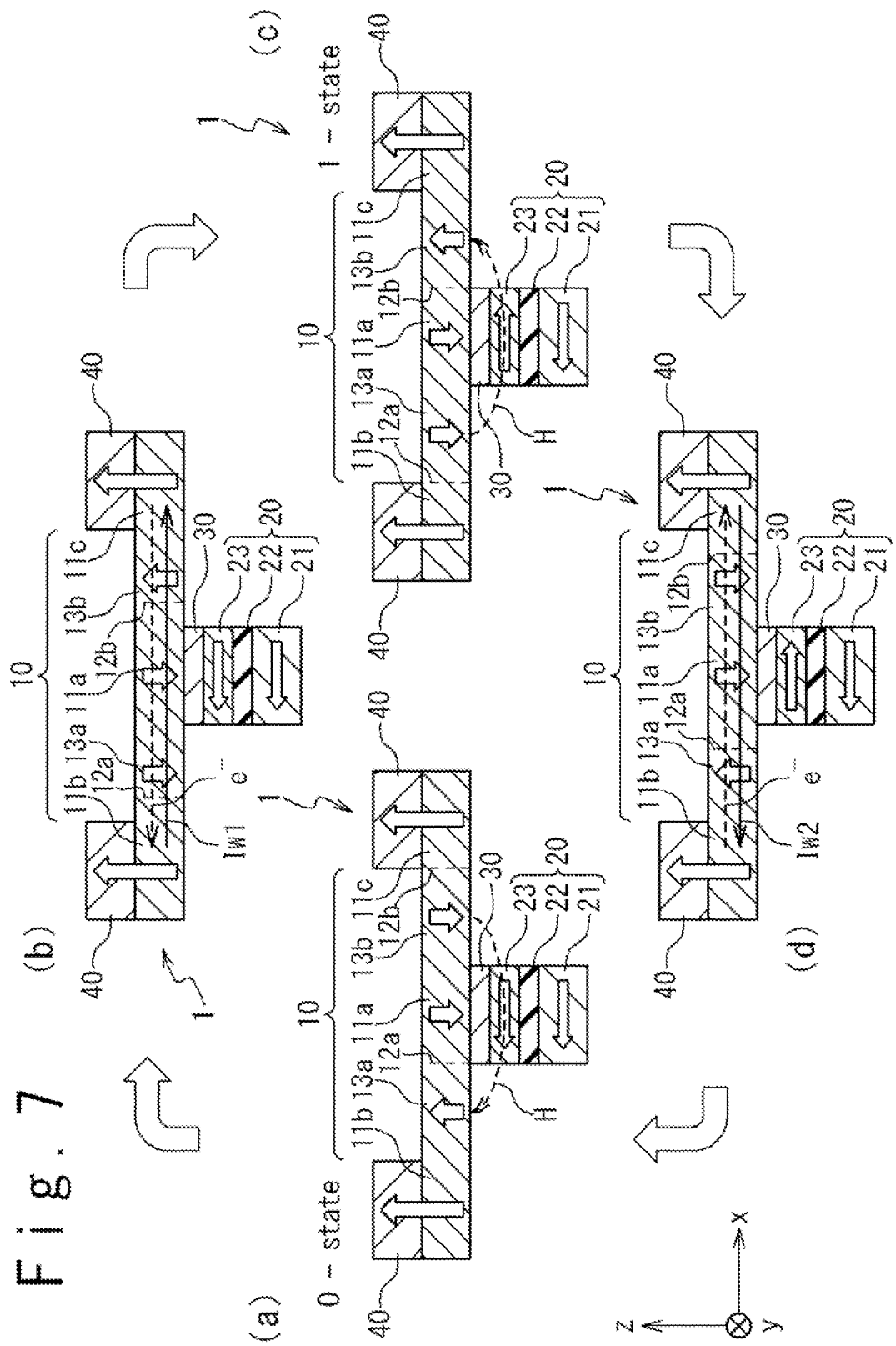

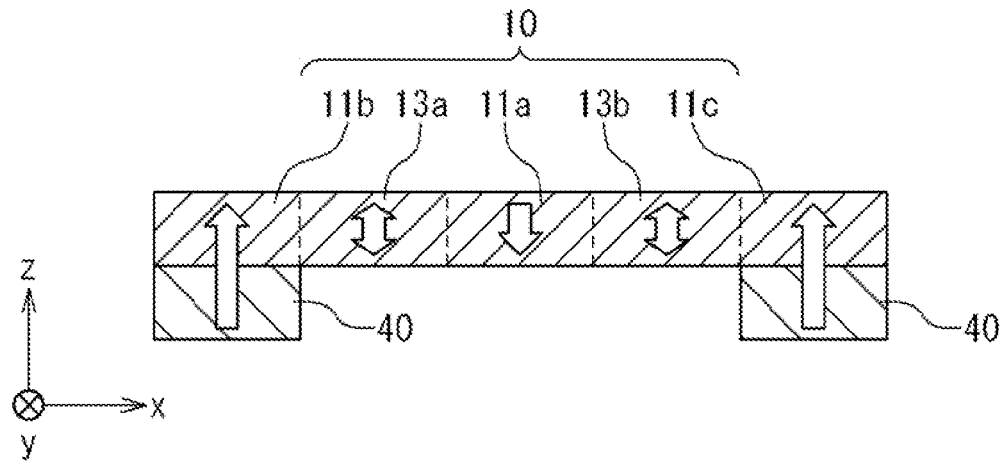
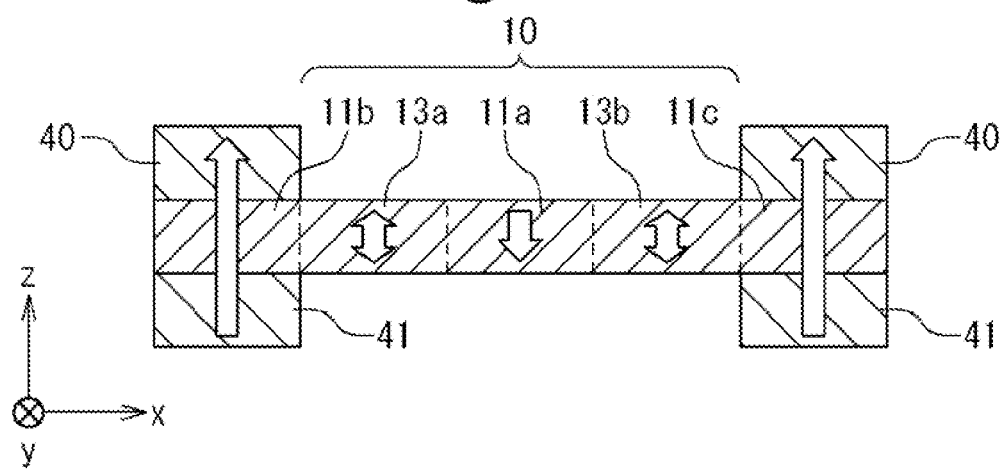
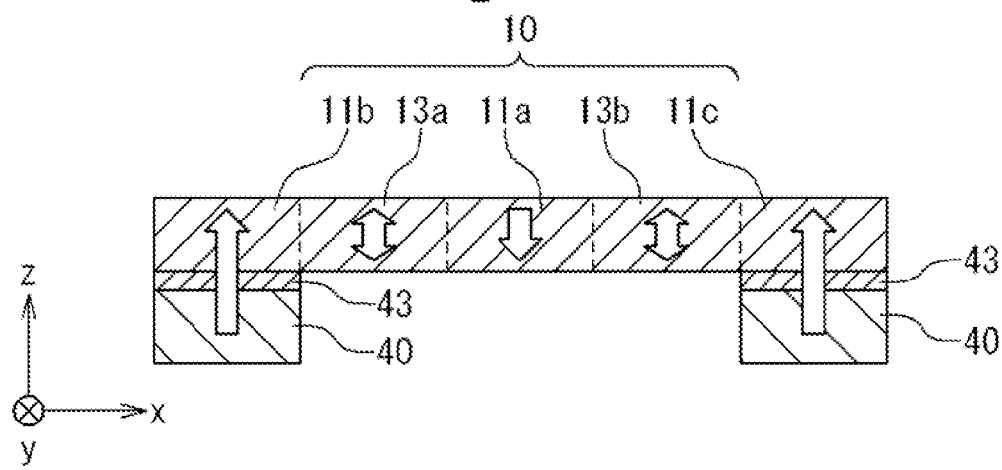

MAGNETIC MEMORY ELEMENT AND MAGNETIC RANDOM ACCESS MEMORY

This application is the National Phase of PCT/JP2009/071408, filed Dec. 24, 2009, which is based upon and claims the benefit of priority from Japanese patent application No. 2008-330507 filed on Dec. 25, 2008 and Japanese patent application No. 2009-229644 filed on Oct. 1, 2009, the disclosures of which are incorporated herein in their entirety by reference.

TECHNICAL FIELD

The present invention relates to a magnetic memory element and a magnetic random access memory, and particularly relates to a dome in wall motion magnetic memory element and a domain wall motion magnetic random access memory.

BACKGROUND ART

A magnetic random access memory (MRAM) is expected and actively developed as a nonvolatile memory capable of performing a high-speed operation and rewriting an infinite number of times. In the MRAM, a magneto-resistance effect element is integrated in a memory cell and data is stored as a magnetization direction of a ferromagnetic layer in the magneto-resistance effect element. Some types of MRAMs are proposed to meet methods of switching the magnetization direction of the ferromagnetic layer.

A current-induced magnetic field writing MRAM is one of the most general MRAMs. In this MRAM, a wiring line that a write current passes through is installed on the periphery of a magneto-resistance effect element and a magnetization direction cf a ferromagnetic layer in the magneto-resistance effect element is switched by a current-induced magnetic field that is generated by the write current passing by. This MRAM can theoretically perform writing at a speed of 1 nano-second or less and thus, is suitable for a high-speed MRAM. For example, a success of an operation at 250 MHz is demonstrated in one report (N. Sakimura et al., "A 250-MHz 1-Mbit Embedded MRAM Macro Using 2T1MTJ Cell with Bitline Separation and Half-Pitch Shift Architecture", Solid-State Circuits Conference, 2007, ASSCC' 07, IEEE Asian p. 216). Further, a circuit configuration suitable for an operation at 500 MHz is proposed (N. Sakimura et al., "MRAM Cell Technology for Over 500-MHz SoC", IEEE JOURNAL OF SOLID-STATE CIRCUITS, Vol, 42, 2007, p. 830).

However, a magnetic field for switching magnetization of a magnetic body securing thermal stability and resistance against external disturbance magnetic field is generally a few dozens of [Oe]. In order to generate such magnetic field, a large write current of about one or a few mA is needed. When a write current is large, a chip area is necessarily large and power consumed for writing increases. In addition, when a size of a memory cell is miniaturized, a write current further increases and is not scaling. The technique is desired that a write current can be reduced according to miniaturization of a size of a memory cell.

As a wiring method that can suppress an increase of the write current according to the miniaturization, a "spin transfer method" is proposed (see Japanese Patent Publication JP2005-93488A and J. C. Slonczewski, "Current-driven excitation of magnetic multilayers", Journal of Magnetism & Magnetic Materials, 159, L1-L7 (1996)). According to the spin transfer method, a spin-polarized current is injected into a ferromagnetic conductor and magnetization is switched due to a direct interaction between spin of conduction electrons that bear the current and the magnetic moment of the conductor (hereinafter referred to as "spin transfer magnetization switching"). Generating of the spin transfer magnetization switching depends on a current density (rather than a current absolute value). Accordingly, when the spin transfer magnetization switching is utilized for data writing, as the size of the memory cell decreases, the write current is also reduced. In other words, the spin transfer magnetization switching method is excellent in scaling performance. When the write current is small, a chip area becomes small, thereby enabling higher integration and larger structure. However, as compared to the current-induced magnetic field writing MRAM, a write time period tends to be longer (ex. 1 nano-second or more).

U.S. Pat. No. 6,834,005 discloses a magnetic shift register using a spin transfer. This magnetic shift register stores data by using domain walls in a magnetic material. In the magnetic material having multiple areas (magnetic domains), a current is introduced to pass through the domain wall thereby moving the domain wall. The magnetization direction of each of the areas is treated as a recorded data. The domain wall motion in a magnetic material is also reported in A. Yamaguchi et al., "Real-Space Observation of Current-Driven Domain Wall Motion in Submicron Magnetic Wires", Physical Review Letters, Vol. 92, pp. 077205-1-4 (2004).

A domain wall motion MRAM using the domain wall motion by the spin transfer is described in Japanese Patent Publication JP2005-191032A and International Publication WO2007/020823A.

The MRAM described in JP2005-191032A includes a magnetization fixed layer in which magnetization is fixed, a tunnel insulating layer laminated on the magnetization fixed layer, and a magnetization recording layer laminated on the tunnel insulating layer. Here, since the magnetization recording layer includes a portion in which a magnetization direction can be switched and a portion in which a magnetization direction is not substantially switched, the layer is called not the magnetization free layer but the magnetization recording layer. FIG. 1 is a schematic plan view showing a structure of the magnetic recording layer in JP2005-191032A. In FIG. 1, the magnetic recording layer 100 has a rectilinear shape. Specifically, the magnetic recording layer 100 includes a connecting portion 103 which overlaps with the tunnel insulating layer and the magnetization fixed layer, constricted portions 109 which are adjacent to both ends of the connecting port ion 103, and a pair of magnetization fixed areas 101 and 102 which are adjacent to the constricted portions 104. The magnetization fixed areas 101 and 102 have fixed magnetization, in which the magnetization direction of the magnetization fixed area 101 is opposite to that of the magnetization fixed area 102. The MRAM further includes a pair of writing terminals 105 and 106 which are electrically connected to the pair of the magnetization fixed areas 101 and 102. By using the writing terminals 105 and 106, the current passing through the connecting portion 103, the pair of the constricted portions 104, and the pair of the magnetization fixed areas 101 and 102 of the magnetic recording layer 100 flows.

FIG. 2 is a schematic plan view showing a structure of a magnetic recording layer 120 of WO2007/020823A. In FIG. 2, the magnetic recording layer 120 has a U-shape. Specifically, the magnetic recording layer 120 includes a first magnetization fixed area 121, a second magnetization fixed area 122, and a magnetization switching area 123. The magnetization switching area 123 overlaps with a pinned layer 130. The first and second magnetization fixed layers 121 and 122 are formed so as to be extended to the y direction. The magnetization directions of the first and second magnetization fixed layers 121 and 122 are the same direction. On the other hand, the magnetization switching area 123 is formed so as to be extended to the x direction. The magnetization direction of the magnetization switching area 123 can be switched. Therefore, a domain wall is formed at one of a boundary B1 between the first magnetization fixed area 121 and the magnetization switching area 123 and a boundary B2 between the second magnetization fixed area 122 and the magnetization switching area 123. The first and second magnetization fixed areas 121 and 122 are connected to current supplying terminals 125 and 126, respectively. By using the current supplying terminals 125 and 126, a write current can be made to flow through the magnetization recording layer 120. The domain wall moves inside the magnetization switching area 123 based on a direction of the write current. According to this domain wall motion, the magnetization direction of the magnetization switching area 123 can be controlled.

However, in the current driven domain wall motion MRAM, there is concern that an absolute value of the write current tends to relatively increase. There are many reports observing the current driven domain wall motion including the foregoing Physical Review Letters, Vol. 92, pp. 077205-1-4 (2004). However, a current density of approximately $1 \times 10^8$ A/cm$^2$ is required as a threshold for the domain wall motion. For example; it is assumed that a width and a thickness of a layer where the domain wall motion arises are 100 nm and 10 nm. In this case, the write current is 1 mA. In order to reduce the write current less than this value, it may be considered that the thickness should be thinner than before. However, in this case, it is known that the threshold current density required for writing further increase (e.g., see A. Yamaguchi et al., "Reduction of Threshold Current Density for Current-Driven Domain Wall Motion using Shape Control", Japanese Journal of Applied Physics, vol. 45, No. 5A, pp. 3850-3853 (2006)).

On the other hand, as for an element using perpendicular magnetic anisotropy material, in which magnetic anisotropy is perpendicular to a substrate surface, for the magnetic recording layer, the following fact is experimentally indicated. That is, the threshold current density required for the current induced domain wall motion is smaller than that of an element using in-plane magnetic anisotropy material. For example, D. Ravelosona et al., "Threshold currents to move domain walls in films with perpendicular anisotropy", Applied Physics Letters, Vol. 90, 072508 (2007) indicates that the threshold current density of approximately $1^6$ A/cm$^2$ order is observed. Further, S. Fukami et al., "Micromagnetic analysis of current driven domain wall motion in nanostrips with perpendicular magnetic anisotropy", J. Appl. Phys. 103, 07E718 (2008) theoretically indicates that the threshold current density required for the current induced domain wall motion is smaller than that of an element using in-plane magnetic anisotropy material. Therefore, in the current driven domain wall motion MRAM, it is expected that the write current can be reduced by using the perpendicular anisotropy material for the magnetic recording layer.

In conjunction with the above-mentioned techniques, Japanese Patent Publication JP2006-73930A discloses a varying method of a magnetization state of magneto-resistance effect element using a domain wall motion, a magnetic memory element and a solid magnetic memory using the method. The magnetic memory element includes a first magnetic layer, an interlayer and a second magnetic layer. The magnetic memory element records information as magnetization directions of the first and second magnetic layers. The magnetic memory element records information by forming regularly magnetic domains with mutual anti-parallel magnetizations and a domain wall separating those magnetic domains in at least one of the magnetic layers and moving the domain wall in the magnetic layer so as to control positions of the adjacent two magnetic domains. The second magnetic layer may have magnetic anisotropy perpendicular to an in-plane direction.

As mentioned above, in the current driven domain wall motion MRAM, there is concern that an absolute value of the write current tends to relatively increase. Therefore, the inventors have studied to reduce the write current by using a perpendicular magnetic anisotropy material as the magnetization recording layer in the current driven domain wall motion MRAM.

FIGS. 3A and 3B are a plan view and a sectional view, respectively, showing a possible magneto-resistance effect element using the perpendicular magnetic anisotropy material. A magnetization recording layer 210 includes a magnetization switching area 213 and a pair of magnetization fixed areas 211a and 211b. Here, in FIGS. 3A and 3B, a symbol of an open circle and a dot, a symbol of an open circle and an x-mark, and a symbol of an open arrow show magnetization directions of areas (e.g., the magnetization switching area 213 and magnetization fixed areas 211a and 211b in FIGS. 3A and 3B) where the symbols are drawn.

The magnetization switching area 213 overlaps with a tunnel insulating layer 232 and a pinned layer 230 and have a function as a free layer. That is, the magnetization switching area 213, the tunnel insulating layer 232 and the pinned layer 230 configure a magnetic tunneling junction (MTJ). The magnetization fixed area 211a is arranged adjacent to one end of the magnetization switching area 213, and the magnetization fixed area 211b is arranged adjacent to the other end of the magnetization switching area 213. At the connecting portions between the magnetization switching area 213 and the magnetization fixed areas 211a and 211b, constricted portions 215 are arranged by applying the pinning potential forming method disclosed in JP2005-191032A. The direction of the fixed magnetization of the magnetization fixed area 211a and the direction of the fixed magnetization of the magnetization fixed area 211b should be opposite to each other. In addition, each constricted port ion 215 functions as pinning potential for the domain wall. The domain wall should be initialized so as to be a domain wall 212a or 212b at an area near the constricted portion 215.

Here, as shown in FIG. 2, if the magnetization recording layer has the in-plane magnetic anisotropy and the magnetization direction is an in-plane direction, by forming the magnetization recording layer to the U-shape, the magnetization directions of the magnetization fixed layers and the position of the domain wall can be easily initialized in an desired condition. However, as shown in FIGS. 3A and 3B, if the magnetization recording layer has the perpendicular magnetic anisotropy and the magnetization direction is a direction perpendicular to the in-plane direction, even by forming the magnetization recording layer to the U-shape, it is quite difficult to initialize the magnetization directions of the magnetization fixed layers and the position of the domain wall using an external magnetic field.

Further, in the domain wall motion MRAM, if the pinning potential forming method disclosed in JP2005-191032A is applied, the size of the constricted portion 215 is small as compared with that of the magnetization recording layer 210 as shown in FIGS. 3A and 3B. Therefore, there may be a case that the shape of the constricted portion 215 is deteriorated due to production tolerance. In that case, since the constricted portion 215 does not have the desired shape, the domain wall 212 cannot be pinned. Therefore, the magneto-resistance effect element cannot function as a magnetic memory cell. In addition, if the miniaturization of the magneto-resistance effect element advances and the width of the magnetization recording layer thereof may become narrow, it is very difficult to form the constricted portion 215 and there is a possibility to require a fabrication technique beyond the limitation of the lithography technique of the semiconductor processing.

CITATION LIST

Patent Literature
  [PTL 1] JP2005-93488A
  [PTL 2] U.S. Pat. No. 6,834,005
  [PTL 3] JP2005-191032A
  [PTL 4] WO2007/020823A
  [PTL 5] JP2006-73930
Non Patent: Literature
  [NPL 1] N. Sakimura et al., Solid-State Circuits Conference, 2007. ASSCC'07. IEEE Asian. p. 216.
  [NPL 2] N. Sakimura et al., IEEE JOURNAL OF SOLID-STATE CIRCUITS, Vol. 42, 2007, p. 830.
  [NPL 3] J. C. Slonczewski, Journal of Magnetism & Magnetic Materials, 159, L1-L7 (1996).
  [NFL 4] A. Yamaguchi et al., Physical Review Letters, Vol. 92, pp. 077205-1-4 (2004).
  [NPL 5] A. Yamaguchi et al., Japanese Journal of Applied Physics, vol. 45, No. 5A, pp. 3850-3853 (2006).
  [NPL 6] D. Ravelosona et al., Applied Physics Letters, Vol. 90, 072508 (2007).
  [NPL 7] S. Fukami et. al., J. Appl. Phys. 103, 07E718 (2008).

SUMMARY OF INVENTION

An object of the present invention is to provide a magnetic memory element and a magnetic random access memory having a structure in which magnetization fixed areas and domain wall pinning sites can be easily formed in a current driven domain wall motion MRAM with perpendicular magnetic anisotropy of a magnetization recording layer.

This and other objects, features and advantages of the present invention will be readily ascertained by referring to the following description and drawings.

A magnetic memory element of the present: invention includes: a magnetization recording layer; and a magnetic tunneling junction section. The magnetization recording layer includes a ferromagnetic layer with perpendicular magnetic anisotropy. The magnetic tunneling junction section is used for reading information in the magnetization recording layer. The magnetization recording layer includes two domain wall moving areas.

A magnetic random access memory of the present invention includes: a plurality of magnetic memory cells configured to he arranged in a matrix shape, each of the plurality of magnetic memory cells including a magnetic memory element described above. A magnetic memory element of a plurality of reference memory cells includes a sensor layer configured to have magnetic anisotropy in a direction perpendicular to a direction connecting between a first domain wall moving area and a second domain wall moving area.

According to the present invention, a magnetic memory element can be provided, in which magnetization fixed areas and domain wall pinning sites can be easily formed.

BRIEF DESCRIPTION OF DRAWINGS

FIG. 6A is a sectional view showing a method of initializing the magnetic memory element according to the embodiment of the present invention;

FIG. 6B is a sectional view showing the method of initializing the magnetic memory element according to the embodiment of the present invention;

FIG. 6C is a sectional view showing the method of initializing the magnetic memory element according to the embodiment of the present invention;

FIG. 7 is a sectional view showing a writing principle of the magnetic memory element according to the embodiment of the present invention;

FIG. 24 is a structural diagram showing an example of a method of fixing magnetization according to the embodiment of the present invention;

FIG. 25 is a structural diagram showing an example of the method of fixing the magnetization according to the embodiment of the present invention;

FIG. 26 is a structural diagram showing an example of the method of fixing the magnetization according to the embodiment of the present invention;

DESCRIPTION OF EMBODIMENTS

Embodiments of a magnetic memory element and a magnetic random access memory (MRAM) of the present invention will be described below referring to the accompanying drawings.

1. Basic Structure of Magnetic Memory Element

Figure 1:
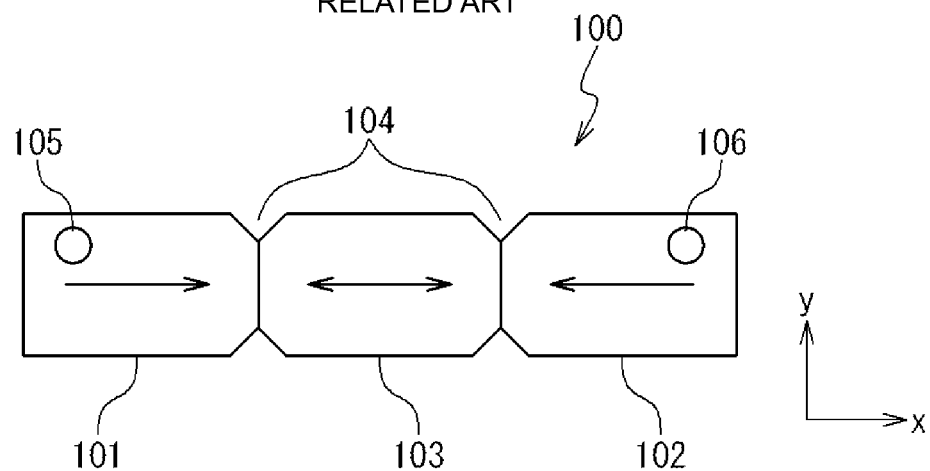
FIG. 1 is a schematic plan view showing a structure of the magnetic recording layer in JP2005-191032A.
Figure 2:
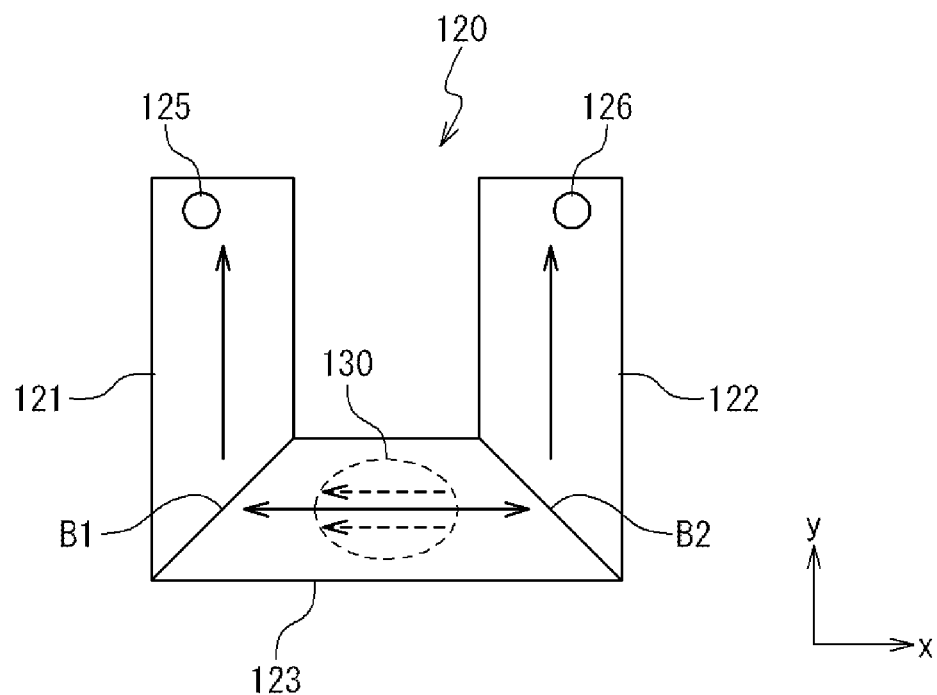
FIG. 2 is a schematic plan view showing a structure of a magnetic recording layer 120 of WO2007/020823A.
Figure 3A:
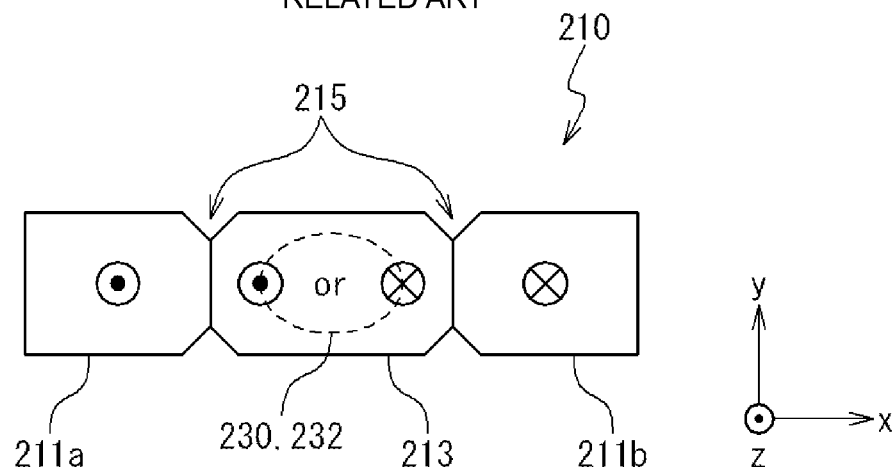
FIG. 3A is a plan view showing a possible magneto-resistance effect element using perpendicular magnetic anisotropy material.
Figure 3B:
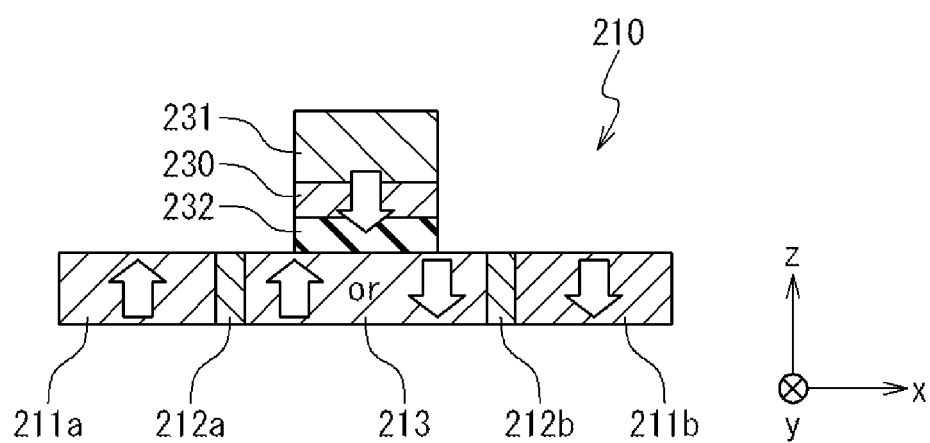
FIG. 3B is a sectional view showing a possible magneto-resistance effect element using perpendicular magnetic anisotropy material.
Figure 4A:
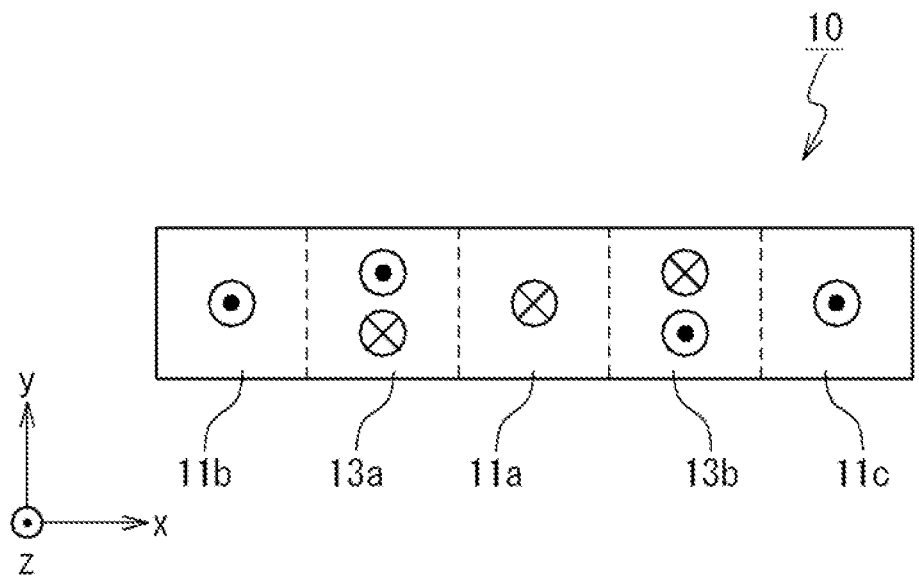
FIG. 4A is a plan view showing a structure of a magnetization recording layer of a magnetic memory element according to an embodiment of the present invention.
Figure 4B:
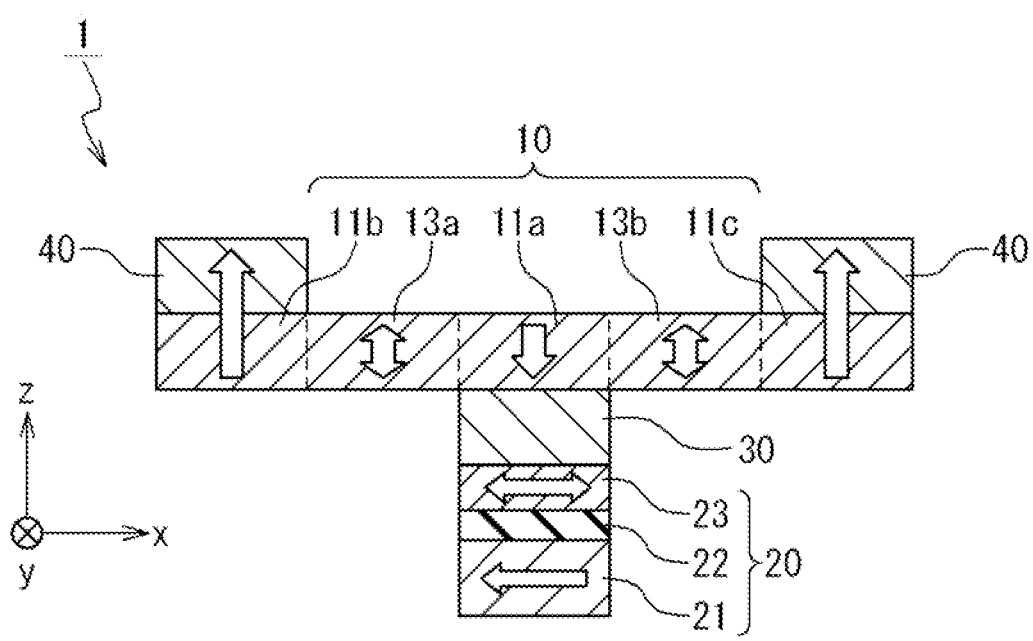
FIG. 4B is a sectional view showing a structure of the magnetic memory element according to the embodiment of the present invention.

FIG. 4A is a plan view showing an example of a structure of a magnetization recording layer of a magnetic memory element according to an embodiment of the present invention. FIG. 4B is a sectional view showing an example of a structure of the magnetic memory element according to the embodiment of the present invention. Here, in FIGS. 9A and 4B, a symbol of an open circle and a dot, a symbol of an open circle and a x-mark, and a symbol of an open arrow show magnetization directions of areas where the symbols are drawn as widely used (hereinafter, these are the same in this Specification and Drawings).

A magnetic Memory element 1 includes: a magnetization recording layer 10; and a magnetic tunneling junction section 20. The magnetization recording layer 10 includes a ferromagnetic layer with perpendicular magnetic anisotropy. The magnetization recording layer 10 includes two domain wall moving areas. The magnetic tunneling junction section 20 is arranged near the center of the magnetization recording layer 10 and is a structure for reading data (information) stored in the magnetization recording layer 10. Details of the magnetization recording layer 10 and the magnetic tunneling junction section 20 will be described later. Incidentally, the magnetic memory, element 1 may further include a contact layer 30 electrically contacting the magnetization recording layer 10 and the magnetic tunneling junction section 20.

The magnetic tunneling junction section 20 includes: a sensor layer 23; a reference layer 21; and a barrier layer 22.

The reference layer 21 includes a ferromagnetic layer with in-plane magnetic anisotropy, in which a magnetization direction is fixed. Here, the in-plane magnetic anisotropy means, for example in FIG. 9B, magnetic anisotropy is in xy-plane. Hereinafter, this is the same in this Specification. The magnetization direction of the reference layer 21 is preferably in a longitudinal direction of the magnetization recording layer 10. For example in FIG. 4B, the magnetization direction of the reference layer 21 is −x direction of ±x directions of the longitudinal direction of the magnetization recording layer 10. The magnetization direction may be opposite to this direction. The reference layer 21 preferably includes a plurality of ferromagnetic layers having synthetic ferromagnetic structure. And/or the reference layer 21 preferably adjoins an antiferromagnetic layer such as Pt—Mn. It is because the magnetization of the reference layer 21 is preferably fixed substantially in one direction since the magnetization direction of the reference layer 21 is made not to be varied during the writing and reading operations.

The sensor layer 23 includes a ferromagnetic layer within-plane magnetic anisotropy, in which a magnetization direction can be switched. The sensor layer 23 is magnetically coupled with the magnetization recording layer 10 as described later. Therefore, the magnetization direction of the sensor layer 23 is varied within in-plane region based on the magnetization state (stored data) of the magnetization recording layer 10. For example of FIG. 4B, the magnetization direction of the sensor layer 23 is rotated within xy-plane region based on the magnetization state (stored data) of the magnetization recording layer 10. The barrier layer 22 includes a non-magnetic film or an insulating film arranged between the sensor layer 23 and the reference layer 21.

The reference layer 21, the barrier layer 22 and the sensor layer 23 constitutes the magnetic tunneling junction (MTJ) as the pinned layer, the tunnel insulating layer and the free layer, respectively. The magnetization direction of the sensor layer 23 is rotated based on the state stored in the magnetization recording layer 10. On the other hand, the magnetization direction of the reference layer 21 is fixed. Therefore, based on a relative relation between the magnetization direction of the sensor layer 23 and the magnetization direction of the reference layer 21, a resistance value of the magnetic tunneling junction section 20 (MTJ) is varied. Thus, by detecting the resistance value of the magnetic tunneling junction section 20, the data stored in the magnetization recording layer 10 can be read. That is, the magnetic tunneling junction section 20 can be used for a means for reading the data stored in the magnetization recording layer 10.

The sensor layer 23 and the reference layer 21 having the in-plane magnetization anisotropy preferably include at least one material selected from Fe, Co, and Ni. In addition, they are adjusted so as to obtain a desired magnetic property by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au or the like. Specifically, Ni—Fe, Co—Fe, Fe—Co—Ni, Ni—Fe—Zr, Co—Fe—B, Co—Fe—Zr—B or the like is exemplified. The barrier layer 22 preferably includes insulating material. Specifically, Mg—O, Al—O, Al—N, Ni—O, Hf—O or the like is exemplified. Further, non-magnetic material such as semiconductor material and metal material can be used as the barrier layer 22 for the embodiment of the present invention. Specifically, Cr, Al, Cu, Zn or the like is exemplified.

Incidentally, as the sensor layer 23, the reference layer 21, and the barrier layer 22, material, which makes the MR ratio corresponding to the SN ration of the read signal large, is preferably selected. For example, as for the MTJ with Co—Fe—B/Mg—O/Co—Fe—B system, very large MR ratio of the 500% level is reported. In the light of this fact, it is preferable that the sensor layer 23 and the reference layer 21 are formed of Co—Fe—B system material and the barrier layer 22 is formed of Mg—O system material.

The magnetization recording layer 10 includes: a first magnetization fixed area 11b, a zero-th magnetization fixed area 11a, the second magnetization fixed area 11c, a first domain wall moving area 13a, and a second domain wall moving area 13b. The first domain wall moving area 13a and the second domain wall moving area 13b are coupled with the both side of the zero-th magnetization fixed area 11a, respectively. The first magnetization fixed area 11b and the second magnetization fixed area 11c are coupled with the outsides the first domain wall moving area 13a and the second domain wall moving area 13b, respectively.

The first magnetization fixed area 11b, the zero-th magnetization fixed area 11a, and the second magnetization fixed area 11c include ferromagnetic areas with perpendicular magnetic anisotropy, in which magnetization directions are fixed. Here, the perpendicular magnetic anisotropy means, for example in FIG. 4B, magnetic anisotropy is perpendicular to xy-plane. Hereinafter, this is the same in this Specification. The magnetization directions of the first magnetization fixed area 11b and the second magnetization fixed area 11c are the same, and the magnetization direction of the zero-th magnetization fixed area 11a is opposite to them. That is, the magnetization of the first magnetization fixed area 11b and the magnetization of the second magnetization fixed area 11c are fixed parallel to each other. The magnetization of the first magnetization fixed area 11b and the second magnetization fixed area 11c and the zero-th magnetization fixed area 11a is fixed antiparallel to each other. Here, the magnetization directions of the first magnetization fixed area 11b, the second magnetization fixed area 11c and the zero-th magnetization fixed area 11a are not strictly limited to the above "the same" and "opposite" case, but may be directions such that these areas 11b, 11c and 11c function to generate domain wall 12a and 12b. In addition, the phrase "magnetization is fixed" means the magnetization direction is not changed before and after the writing operation. During the writing operation, even if the magnetization direction of a part of the magnetization fixed layer is fluctuated, the magnetization direction becomes the original state again after the end of the writing operation. For example of FIG. 4B, the magnetization directions of the first magnetization fixed area 11b and the second magnetization fixed area 11c are +z directions, and the magnetization direction of the zero-th magnetization fixed layer 11a is −z direction. These directions may be opposite to the above case.

The first magnetization fixed layer 11b and the second magnetization fixed layer 11c are preferably formed substantially identical to each other. It is because forming substantially identical to each other is the easiest way in the light of the manufacturing process and the high symmetrical property is preferable in the light of the stability and reliability in the writing operation and storing data, which are. described later. Here, the phrase "substantially identical" means material and a shape including a thickness are identical within a range of manufacturing process error. In this case, a method of fixing magnetization (described later) is also identical.

First hard layers 40 are preferably formed adjacent to the first magnetization fixed area 11b and the second magnetization fixed area 11c, respectively. The first hard layer 40 effectively makes the coercivity of each of the first magnetization fixed area 11b and the second magnetization fixed area 11c larger than the coercivity of each of the first domain wall moving area 13a, the zero-th magnetization fixed area 11a and the second domain wall moving area 13b to make the initialization easy. In the case of arranging the first hard layers 40, it is preferable that the first magnetization fixed area 11b and the first hard layer 40 is substantially identical to the second. magnetization fixed area 11c and the first hard layer 40 as the meaning mentioned above.

The first domain wall moving area 13a and the second domain wall moving area 13b include ferromagnetic areas with perpendicular magnetic anisotropy, in which magnetization directions can be switched, and through which the domain wall can be moved. Therefore, magnetization direction combinations available for the first domain wall moving area 13a and the second domain wall moving area 13b are four combinations of (+z, −z), (−z, −z), (+z, +z), and (−z, −z). In this embodiment, the two magnetization direction combinations of (+z, −z) and (−z, +z) are used based on data to be stored.

The above-mentioned magnetic tunneling junction section 20 is arranged near the zero-th magnetization fixed area 11a. The magnetization direction of the reference layer 21 of the magnetization tunneling junction section 20 is in the direction of the straight line connecting the first domain wall moving area 13a and the second domain wall moving area 13b. In the example of FIG. 4B, the magnetization direction cf the reference layer 21 is in the direction of the straight line connecting (the centre of gravity of) the first domain wall moving area 13a and (the centre of gravity of) the second domain wall moving area 13b, namely, ±x direction. The magnetization direction of the sensor layer 23 will be described later.

The magnetization recording layer 10 having the perpendicular magnetic anisotropy preferably includes at least one material selected from Fe, Co, and Ni. The perpendicular magnetic anisotropy can be stabilized by including Pt and Pd. In addition, the magnetization recording layer 10 is adjusted so as to obtain a desired magnetic property by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm or the like. Specifically, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, Gd—Fe—Co, Tb—Fe—Co, Gd—Tb—Fe—Co or the like is exemplified. Or, the perpendicular magnetic anisotropy can be generated by alternately laminating a layer including any material selected from Fe, Co, and Ni and another layer. Specifically, a lamination film with alternately laminating Cc/Pd, Co/Pt, Co/Ni, or Fe/Au is exemplified. For the first hard layer 40, the ferromagnetic material mentioned above or anti-ferromagnetic material such as PtMn, NiMn, and FeMn can be used.

Here, the typical dimensions of the magnetic memory element 1 are, when the design rule is F=90 nm, as follows:

the magnetization recording layer 10: 450 nm×90 nm×5 nm$^r$; in the magnetic tunneling junction section 20, the reference layer 21: 90 nm×90 nm×25 nm$^r$; the barrier layer 22: 90 nm×90 nm×1 nm$^r$; the sensor layer 23: 90 nm×90 nm×2 nm$^r$; the contact layer 30: 90 nm×90 nm×20 nm$^r$.

2. Data Stored States

Figure 5A:
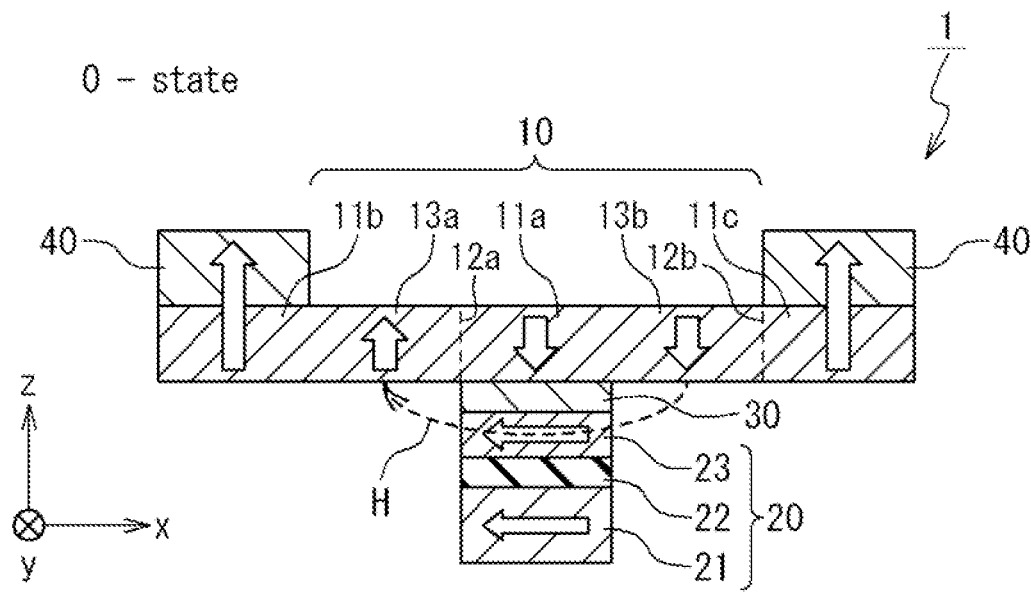
FIG. 5A is a sectional view showing the structure of the magnetic memory element according to the embodiment of the present invention.
Figure 5B:
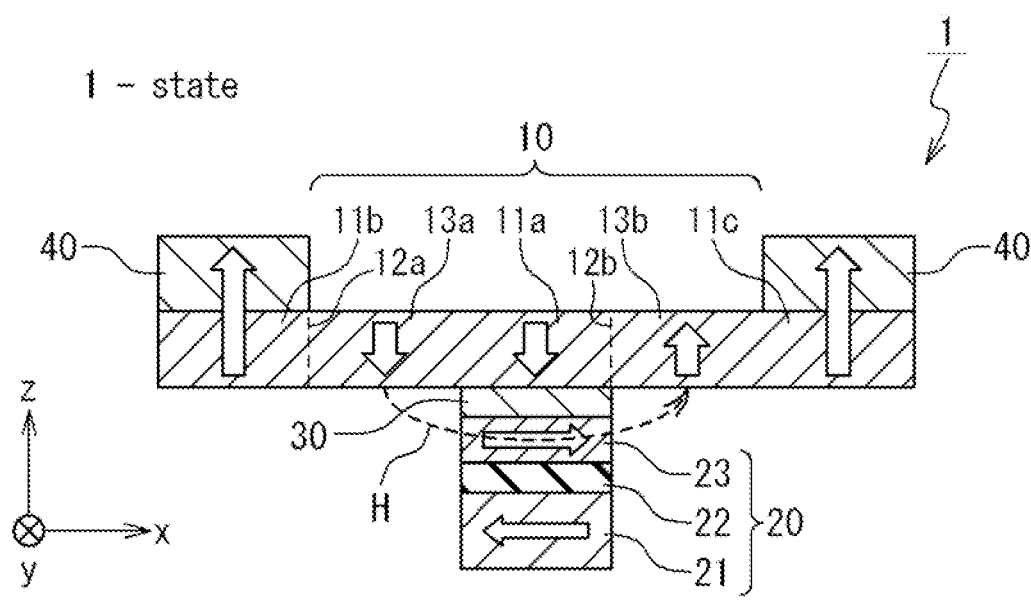
FIG. 5B is a sectional view showing the structure of the magnetic memory element according to the embodiment of the present invention.

FIGS. 5A and 5B are sectional views each showing an example of the structure of the magnetic memory element according to the embodiment of the present invention. FIG. 5A shows the case in which data "0" is stored (0-state) and FIG. 5B shows the case in which data "1" is stored (1-state).

As shown in FIG. 5A, when the magnetization recording layer 10 stores the data "0", the magnetization of the first domain wall moving area 13a is in the +z direction, the magnetization of the second domain wall moving area 13b is in the −z direction (+z, −z). In this case, the first magnetization fixed layer 11b and the first domain wall moving area 13a have the magnetization with the +z direction, the zero-th magnetization fixed area 11a and the second domain wall moving area 13b have the magnetization with the −z direction, and the second magnetization fixed area 11c has the magnetization with the +z direction. That is, the first magnetization fixed layer 11b and the first domain wall moving area 13a, the zero-th magnetization fixed area 11a and the second domain wall moving area 13b, and the second magnetization fixed area 11c constitute magnetic domains, respectively, those magnetic domains being different from each other. Consequently, between the first domain wall moving area 13a and the zero-th magnetization fixed area 11a, and between the second domain wall moving area 13b and the second magnetization fixed area 11c, the domain walls 12a and 12b are formed, respectively.

At that time, under the magnetization recording layer 10 (−z direction side), the magnetic field H directed from the second domain wall moving area 13b toward the first domain wall moving area 13a is generated. The magnetic field H is the magnetic field directed to the −x direction near the sensor layer 23. Therefore, the magnetization of the sensor layer 23 is made to be directed in the −x direction. That is, the data stored in the magnetization recording layer 10 is reflected to the sensor layer 23. Consequently, in the magnetic tunneling junction section 20, the magnetization of the sensor layer 23 and the magnetization of the reference layer 21 are parallel to each other. Therefore, by detecting the resistance value in the ±z direction of the magnetic tunneling junction section 20, this parallel state can be detected. That is, the data "0" stored in the magnetization recording layer 10 can be read.

On the other hand, as shown in FIG. 5B, when the magnetization recording layer 10 stores the data "1", the magnetization of the first domain wall moving area 13a is in the −z direction, the magnetization of the second domain wall moving area 13b is in the +z direction (−z, +z). In this case, the first magnetization fixed layer 11b has the magnetization with the +z direction, the first domain wall moving area 13a and the zero-th magnetization fixed area 11a have the magnetization with the −z direction, and the second domain wall moving area 13b and the second magnetization fixed area 11c have the magnetization with the +z direction. That is, the first magnetization fixed layer 11b, the first domain wall moving area 13a and the zero-th magnetization fixed area 11a, and the second domain wall moving area 13b and the second magnetization fixed area 11c constitute magnetic domains, respectively, those magnetic domains being different from each other. Consequently, between the first magnetization fixed area 11b and the first domain wall moving area 13a, and between the zero-th magnetization fixed area 11a and the second domain wall moving area 13b, the domain walls 12a and 12b are formed, respectively.

At that time, under the magnetization recording layer 10 (−z direction side), the magnetic field H directed from the first domain wall moving area 13a toward the second domain, wall moving area 13b is generated. The magnetic field H is the magnetic field directed to the +x direction near the sensor layer 23. Therefore, the magnetization of the sensor layer 23 is made to be directed in the +x direction. That is, the data stored in the magnetization recording layer 10 is reflected to the sensor layer 23. Consequently, in the magnetic tunneling junction section 20, the magnetization of the sensor layer 23 and the magnetization of the reference layer 21 are anti-parallel to each other. Therefore, by detecting the resistance value in the ±z direction of the magnetic tunneling junction section 20, this anti-parallel state can be detected. That is, the data "1" stored in the magnetization recording layer 10 can be read.

Incidentally, a method of stopping the domain walls 12a and 12b at the positions shown in the respective states of FIGS. 5A and 5B will be described later.

As described above, the magnetization recording layer 10 stores data based on the mutual relation between the magnetization directions of the respective domain wall moving areas. In these data storing states, as a result, by magnetic interaction between the sensor layer 23, the second domain wall moving area 13b, and the first domain wall moving area 13a, the magnetization recorded in the sensor layer 23 functions to stabilize the magnetization state (magnetization direction) of the second domain wall moving area 13b and the first domain wall moving area 13a. Therefore, in the respective states of FIGS. 5A and 5B, the domain walls of 12a and 12b can be more stably fixed (hold) at the desired positions.

3. A Method of Initializing the Magnetization Fixed Areas

Next, a method of initializing the magnetic memory element according to the embodiment of the pre sent invention will be described.

FIGS. 6A to 6C are sectional views showing an example of a method of initializing the magnetic memory element according to the embodiment of the present invention.

First, as shown in FIG. 6A, in a magnetic annealing furnace or the like, the magnetic memory element 1 is heated at a desired temperature, and then, the magnetic memory element 1 is cooled down while a magnetic field H01 with the −x direction is applied to the magnetic memory element 1 (step 1). By magnetically polarizing the magnetic memory element 1 in the magnetic field H01 with heating, the reference layer 21 of the magnetic tunneling junction section 20 is magnetized in the −x direction. Here, since the magnetization recording layer 10 is formed of the material with the perpendicular magnetic anisotropy, the magnetization recording layer 10 cannot be magnetized in the −x direction.

Next, as shown in FIG. 6B, a magnetic field H02 with the +z direction is applied to the magnetic memory element 1 (step 2). Here, the magnetic field H02 is set so as to be larger than the coercivities of the first hard layer 40 and the magnetization recording layer 10. As a result, a whole magnetization of the hard layer 40 and the magnetization recording layer 10 is made to be directed in the +z direction. Here, since the reference layer 21 of the magnetic tunneling junction section 20 is formed of the material with the in-plane magnetic anisotropy and magnetically polarized with heating, the reference layer 21 cannot be magnetized in the +z direction. In addition, the substantial coercivities of the first magnetization fixed area 11b and the second magnetization fixed area 11c become larger than the coercivities of the first domain wall moving area 13a, the zero-th magnetization fixed area 11a, and the second domain wall moving area 13b by exchange-coupling between the hard layers 40 and the first and second magnetization fixed areas 11b and 11c.

After that, as shown in FIG. 6C, a magnetic field H03 with the −z direction is applied to the magnetic memory element 1 (step 3). Here, the magnetic field H03 is set so as to be larger than the coercivities of the first domain wall moving area 13a, the zero-th magnetization fixed area 11a, and the second domain wall moving area 13b, and smaller than the substantial coercivities of the first magnetization fixed area 11b and the second magnetization fixed area 11c. As a result, the magnetization of the first domain wall moving area 13a, the zero-th magnetization fixed area 11a, and the second domain wall moving area 13b, of which the coercivities are relatively small in the magnetization recording layer 10, is made to be switched in the −z direction. The magnetization of the first magnetization fixed area 11b and the second magnetization fixed area 11c, of which the coercivities are relatively large in the magnetization recording layer 10, cannot be made to be switched in the −z direction. Since the reference layer 21 of the magnetic tunneling junction section 20 is formed of the material with the in-plane magnetic anisotropy and magnetically polarized with heating, the reference layer 21 cannot be magnetized in the −z direction.

According to the initializing method mentioned above, three areas are formed, which are the first magnetization fixed area 11b, the second magnetization fixed area 11c, and an coupling area where the first domain wall moving area 13a, the zero-th magnetization fixed area 11a and the second domain wall moving area 13b are coupled. At the boundary of the first magnetization fixed area 11b and the coupling area and the boundary of the second magnetization fixed area 11c and the coupling area, the domain walls 12a and 12b are formed, respectively. This state is different from the state in which the data "0" or "1" is stored as shown in FIG. 5A or 5B. However, this is the state that the data can be stored by a writing method described later.

4. Writing Operation

Next, a data writing principle of the magnetic memory element will be described.

FIG. 7 is a sectional view showing the data writing principle of the magnetic memory element according to the embodiment of the present invention. The data writing is performed by using the domain wall motion method with the spin transfer. The writing current Iw flows not in the direction passing through the MTJ (magnetic tunneling junction section 20) but in the direction passing through the domain walls 12a and 12b in-plane of the magnetization recording layer 10. The writing current Iw is supplied from one of a current supplying terminal (not shown) connected to the first magnetization fixed area 11b and a current supplying terminal (not shown) connected to the second magnetization fixed area 11c to the magnetization recording layer 10.

As shown in (a) of FIG. 7, the state in which the magnetization direction of the first domain wall moving area 13a is in the +z direction and the magnetization direction of the second domain wall moving area 13b is in the −z direction corresponds to the data "0", as shown in FIG. 5A. Here, as shown in (b) of FIG. 7, in the writing operation of the data "1", the first writing current Iw1 (solid arrow) is supplied from the current supplying terminal at the side of the first magnetization fixed area 11b. Then, the first writing current Iw1 flows from the first magnetization fixed area 11b to the zero-th magnetization fixed area 11a through the first domain wall moving area 13a. Further, the first writing current Iw1 flows from the zero-th magnetization fixed area 11a to the second magnetization fixed area 11c through the second domain wall moving area 13b, and flows out from the current supplying terminal at the side of the second magnetization fixed area 11c. In this case, the motion (dashed arrow) of electrons e⁻ is opposite to the first writing current Iw1. Thus, spin electrons e− are injected into the second domain wall moving area 13b from the second magnetization fixed area 11c. The spins of the injected electrons e− drive the domain wall 12b at the boundary between the second magnetization fixed area 11c and the second domain wall moving area 13b in the direction to the zero-th magnetization fixed area 11a. As a result, based on the spin transfer effect, the magnetization direction of the second domain wall moving area 13b is switched in the +z direction. The domain wall 12b is moved to the boundary between the second domain wall moving area 13b and the zero-th magnetization fixed area 11a. Further, spin electrons e− are injected into the first domain wall moving area 13a from the zero-th magnetization fixed area 11a. The spins of the injected electrons e− drive the domain wall 12a at the boundary between the zero-th magnetization fixed area 11a and the first domain wall moving area 13a in the direction to the first magnetization fixed area 11b. As a result, based on the spin transfer effect, the magnetization direction of the first domain wall moving area 13a is switched in the −z direction. The domain wall 12a is moved to the boundary between the first domain wall moving area 13a and the first magnetization fixed area 11b. Finally, the data "1" is written as shown in (c) of FIG. 7.

As shown in (c) of FIG. 7, the state in which the magnetization direction of the first domain wall moving area 13a is in the −z direction and the magnetization direction of the second domain wall moving area 13b is in the +z direction corresponds to the data "1", as shown in FIG. 5B. Here, as shown in (d) of FIG. 7, in the writing operation of the data "0", the second writing current Iw2 (solid arrow) is supplied from the current supplying terminal at the side of the second magnetization fixed area 11c. Then, the second writing current Iw2 flows from the second magnetization fixed area 11c to the zero-th magnetization fixed area 11a through the second domain wall moving area 13b. Further, the second writing current Iw2 flows from the zero-th magnetization fixed area 11a to the first magnetization fixed area 11b through the first domain wall moving area 13a, and flows out from the current supplying terminal at the side of the first magnetization fixed area 11b. In this case, the motion (dashed arrow) of electrons e⁻ is opposite to the second writing current Iw2. Thus, spin electrons e− are injected into the first domain wall moving area 13a from the first magnetization fixed area 11b. The spins of the injected electrons e− drive the domain wall 12a at the boundary between the first magnetization fixed area 11b and the first domain wall moving area 13a in the direction to the zero-th magnetization fixed area 11a. As a result, based on the spin transfer effect, the magnetization direction of the first domain wall moving area 13a is switched in the +z direction. The domain wall 12a is moved to the boundary between the first domain wall moving area 13a and the zero-th magnetization fixed area 11a. Further, spin electrons e– are injected into the second domain wall moving area 13b from the zero-th magnetization fixed area 11a. The spins of the injected electrons e– drive the domain wall 12b at the boundary between the zero-th magnetization fixed area 11a and the second domain wall moving area 13b in the direction to the second magnetization fixed area 11c. As a result, based on the spin transfer effect, the magnetization direction of the second domain wall moving area 13b is switched in the –z direction. The domain wall 12b is moved to the boundary between the second domain wall moving area 13b and the second magnetization fixed area 11c. Finally, the data "0" is written as shown in (a) of FIG. 7.

As shown above, by using the writing currents Iw1 and Iw2 which flow in the magnetization recording layer 10 in-plane manner, the magnetization directions of the first domain wall moving area 13a and the second domain wall moving area 13b are switched, respectively. Here, the first magnetization fixed area 11b and the zero-the magnetization fixed area 11a respectively function to supply spin electrons different from each other to the first domain wall moving area 13a. In addition, the zero-th magnetization fixed area 11a and the second magnetization fixed area 11c respectively function to supply spin electrons different from each other to the second domain wall moving area 13b.

In this case, the magnetization recording layer 10 is formed of the material with the perpendicular magnetic anisotropy. Thus, the magnetization direction in each area of the magnetization recording layer 10 is perpendicular with respect to the writing currents Iw1 and Iw2. Therefore, the writing currents Iw1 and Iw2 can be remarkably reduced. At that time, the writing currents Iw1 and Iw2 may flow through anywhere if passing through the domain walls 12a and 12b.

As shown above, the data "0" and the data "1" can be separately written in the magnetic memory element 1 based on the direction of the writing current flowing through the magnetization recording layer 10. In addition, based on the above-mentioned writing principle, it is clear that overwriting (writing the data "0" over the data "0", writing the data "1" over the data "0") can be also performed.

5. Reading Operation

Next, a data reading principle of the magnetic memory element will be described.

Figure 8A:
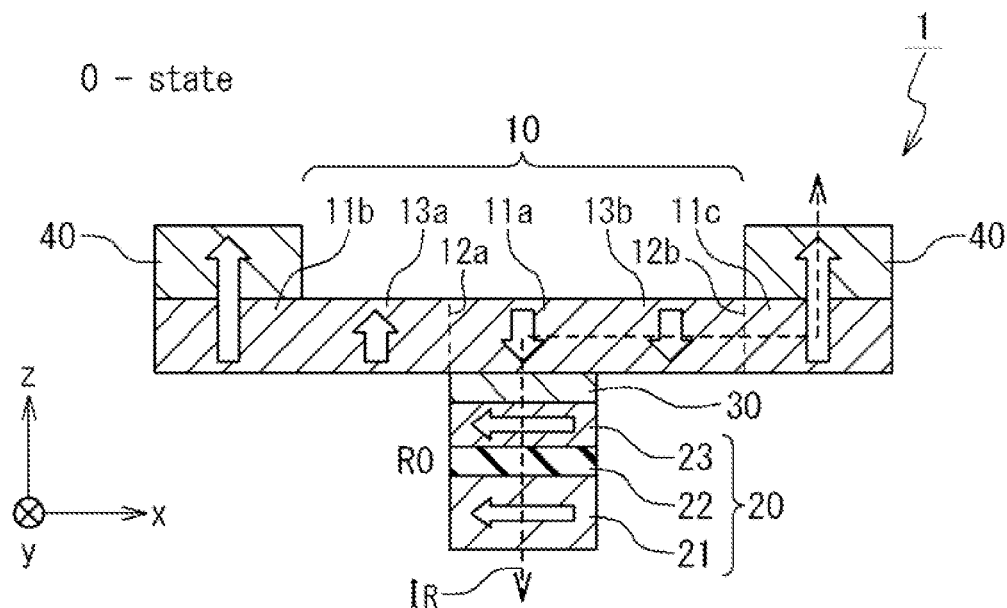
FIG. 8A is a sectional view showing a reading principle of the magnetic memory element according to the embodiment of the present invention.
Figure 8B:
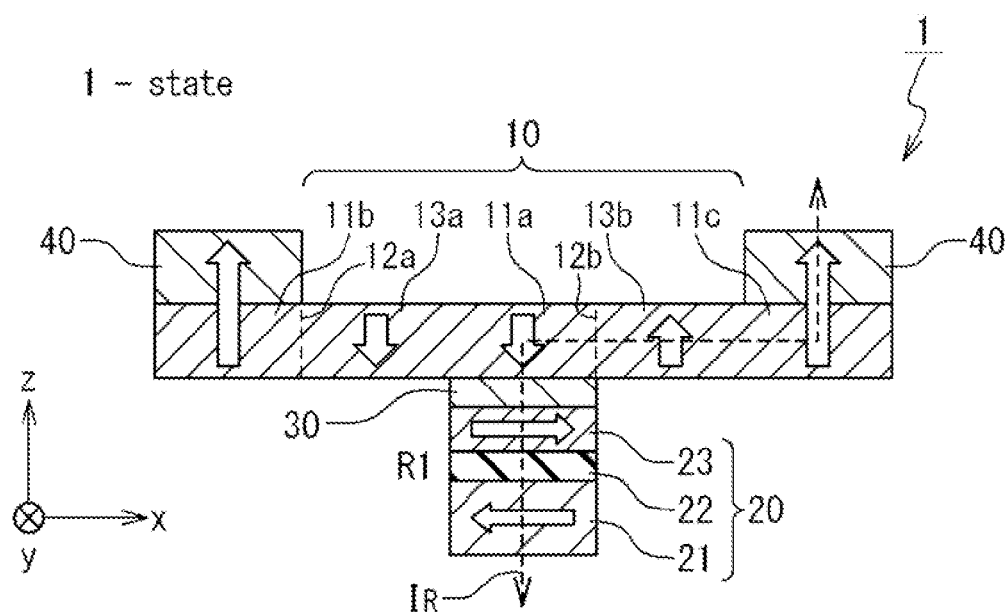
FIG. 8B is a sectional view showing the reading principle of the magnetic memory element according to the embodiment of the present invention.

FIGS. 8A and 8B are sectional views showing the data reading principle of the magnetic memory element according to the embodiment of the present invention. In the data reading operation, the reading current IR is supplied so as to flow through the MTJ of the magnetic tunneling junction section 20 (reference layer 21, barrier layer 22, and sensor layer 23). If the reading current IR is supplied as mentioned above, it is not important that whether or not the reading current IR flows through the magnetization recording layer 10. For example of FIGS. 8A and 8B, the reading current IR is supplied from one of the current supplying terminal at the side of the reference layer 21 and the current supplying terminal at the side of the second magnetization fixed area 11c and flows out from the other one. Therefore, the reading current IR flows through the MTJ of the magnetic tunneling junction section 20 and also flows in the zero-th magnetization fixed area 11a, the second domain wail moving area 13b, and the second magnetization fixed area 11c.

When the data "0" is stored in the magnetization recording layer 10 (see FIG. 8A), the magnetization of the sensor layer 23 is in the –x direction. Here, the magnetization of the reference layer 21 is fixed in the –x direction. That is, the two magnetization directions are parallel. Therefore, by making the above reading current IR flow, the low resistance which means the data "0" can be read as the data stored in the magnetic memory element. On the other hand, when the data "1" is stored in the magnetization recording layer 10 (see FIG. 8B), the magnetization of the sensor layer 23 is in the +x direction. However, the magnetization of the reference layer 21 is fixed in the –x direction. That is, the two magnetization directions are anti-parallel. Therefore, by making the above reading current IR flow, the high resistance which means the data "1" can be read as the data stored in the magnetic memory element.

As described above, the data stored in the magnetization recording layer 10 of the magnetic memory element 1 can be read. In addition, the relatively large current required for the data writing does not flow through the MTJ, instead, it is enough to make the relatively small current flow through the MTJ for the data reading. Therefore, the degradation of the MTJ can be suppressed.

6. Configuration and Operation of Magnetic Memory Element and MRAM

Figure 9:
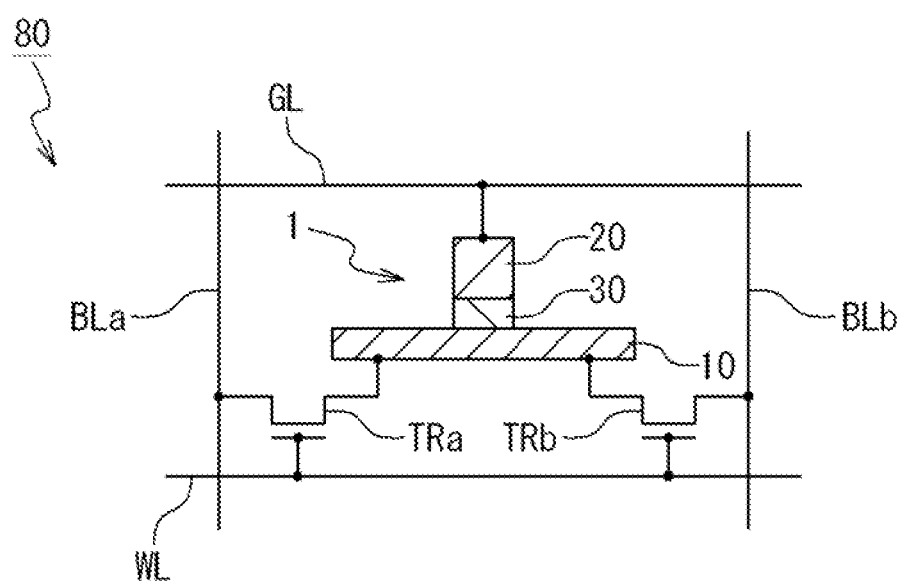
FIG. 9 is a circuit diagram showing a configuration example of a memory cell according to the embodiment of the present invention.

FIG. 9 is a circuit diagram showing a configuration example of a memory cell in which the magnetic memory elements are integrated according to the embodiment of the present invention. As shown in FIG. 9, in the magnetic memory element 1, a terminal connected to the reference layer 21 of the magnetic tunneling junction section 20 is connected to a ground line GL for the reading. One of two terminals connected to the first magnetization fixed area 11b and the second magnetization fixed area 11c of the magnetization recording layer 10 is connected to one of a source and a drain of a MOS transistor TRa, and the other of the two terminals is connected to one of a source and a drain of a MOS transistor TRb. The other of the source and the drain of the MOS transistor TRa is connected to a bit line BLa for the writing and the other of the source and the drain of the MOS transistor TRb is connected to a bit line BLb for the writing. Gates of the MOS transistors TRa and TRb are connected to a word line WL. However, the configuration of the memory cell is not limited to this configuration example.

Figure 10:
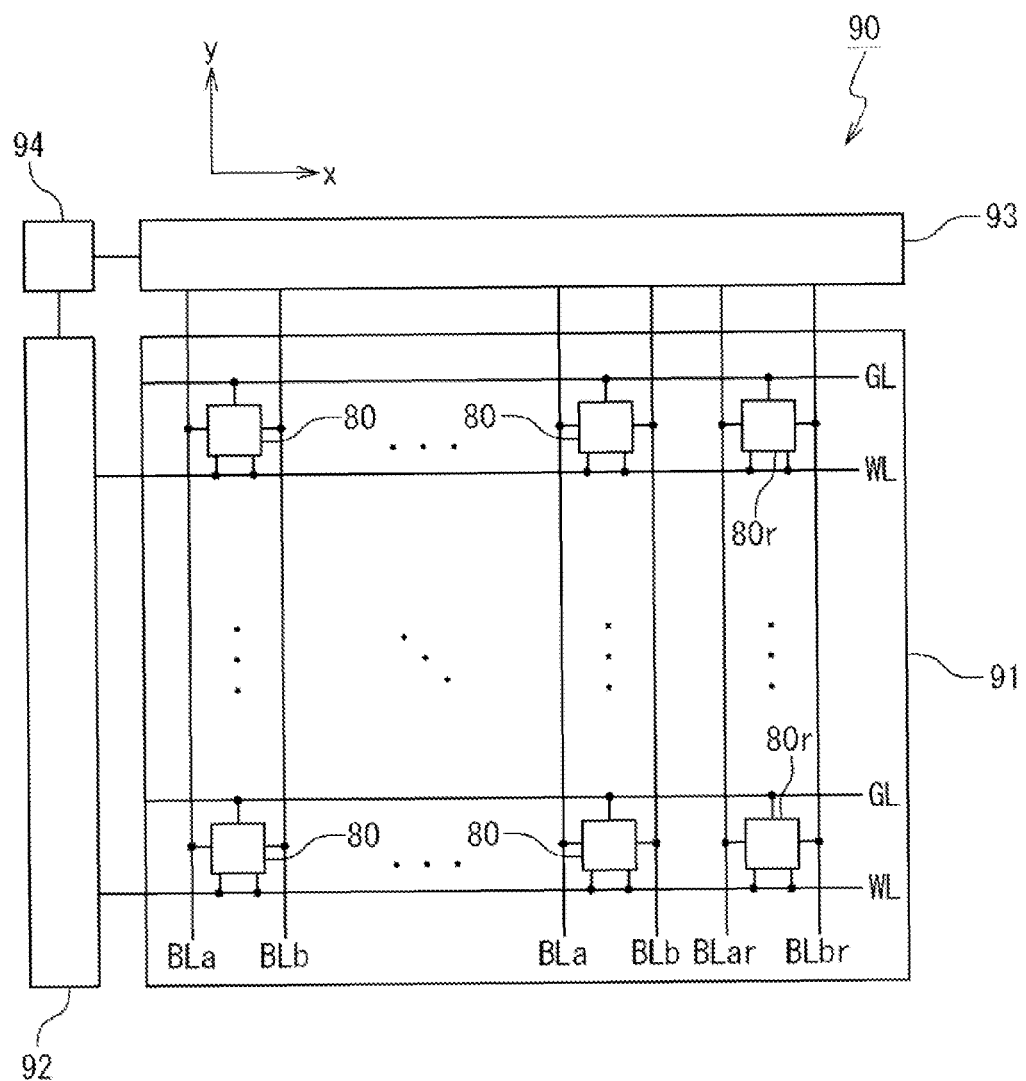
FIG. 10 is a block diagram showing a configuration example of a MRAM according to the embodiment of the present invention.

FIG. 10 is a block diagram showing a configuration example of a MRAM in which the memory cells are integrated according to the embodiment of the present invention. In FIG. 10, the MRAM 90 includes a memory array 91 in which a plurality of the memory cells 80 is arranged in a matrix shape. This memory array 91 includes not only the memory cells 80 for the data recording as shown in FIG. 9, but also reference cells 80r as a reference for the data reading For example of FIG. 10, one column is used for the reference cells 80r. The configuration of the reference cell 80r is the same as that of the memory cell 80. In this case, the MTJ of the reference cell 80r has a resistance value R0.5 which is a middle value between a resistance value R0 and a resistance value R1, the R0 being the resistance value when the data "0" is stored and the R1 being the resistance value when the data "1" is stored. Here, two columns may be used for the reference cells 80r, in which one column of them may be used for the reference cells 80r having the resistance value R0 and the other one column of them may be used for the reference cells 80r having the resistance value R1. In this case, the resistance value R0.5 for the data reading is prepared by using the reference cell 80r with the resistance value R0 and the reference cell 80r with the resistance value R1.

The word lines WL and the ground lines GL are extended in the x direction, respectively. The word line WL is connected to an X side control circuit 92 at one end. The X side control circuit 92 selects a word line WL connected to a target memory cell 8C as a selection word line WL in the data writing and data reading operations. The bit lines BLa and BLb are extended in the y direction and connected to a Y side control circuit 93 at one ends. The Y side control circuit 93 selects a bit line BLa and a bit line BLb connected to a target memory cell 80 as a selection bit line BLa and a selection bit line BLb in the data writing and data reading operations. The control circuit 94 controls the X side control circuit 92 and the Y side control circuit 93 in the data writing and data reading operations.

Next, the writing and reading methods of the MRAM shown in FIG. 10 will be described.

First, the writing method will be described. The X side control circuit 92 selects the selection word line WL. As a result, the selection word line WL is pulled up to the high level and the MOS transistors TRa and TRb are turned on. In addition, the Y side control circuit 93 selects the selection bit lines BLa and BLb. As a result, one of the selection bit lines BLa and BLb is pulled up to the high level and the other is pulled down to the low level. Which of the selection bit lines BLa and BLb is pulled up to the high level and pulled down to the low level is determined based on the data to be written in the target magnetic memory element 1. That is, it is determined based on the direction in which the writing current Iw flows through the magnetization recording layer 10. As described above, the data "0" and the data "1" can be separately written. The X side control circuit 92, the Y side control circuit 93, and the control circuit 94 constitute "a writing current supplying circuit" which supplies the writing current Iw to the memory cell 80.

Next, the reading method will be described. The X side control circuit 92 selects the selection word line WL. As a result, the selection word line WL is pulled up to the high level and the MOS transistors TRa and TRb are turned on. In addition, the Y side control circuit 93 selects the selection bit lines BLa and BLb. As a result, one of the selection bit lines BLa and BLb is pulled up to the high level and the other is set to be open (floating). At that time, for example, the reading current IR flows from the one of the selection bit lines BLa and BLb to the ground line GL through the second magnetization fixed area 11*c*, the second domain wall moving area 13*b*, the zero-th magnetization fixed area 11*a*, the contact layer 30, and the magnetic tunneling junction section 20 (the MTJ composed of the sensor layer 23, the barrier layer 22, and the reference layer 21). The potential at the bit line BL in which the reading current IR flows or the value of the reading current IR depends on the variation of the resistance value of the magnetic memory element 1 (the magnetic tunneling junction section 20) caused by the magneto-resistive effect. Therefore, by comparing the resistance value with an output of a reference bit line Bbr of the reference cell 80*r* in which the reading current IR flows similarly to detect the variation of the resistance value as a voltage signal or a current signal, the high speed data reading can be performed. The X side control circuit 92, the Y side control circuit 93, and the control circuit 94 constitute "a reading current supplying and sensing circuit" which supplies the writing current Iw to the memory cell 80 and reads data in the memory cell 80.

Figure 11:
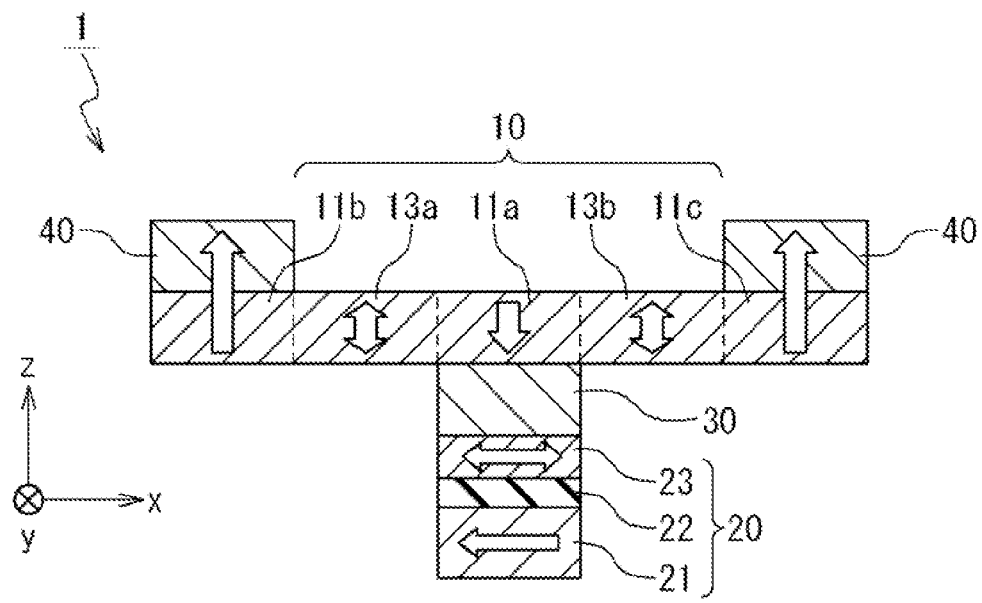
FIG. 11 is a structural diagram showing an example of a sensor layer of the magnetic memory element according to the embodiment of the present invention.
Figure 12:
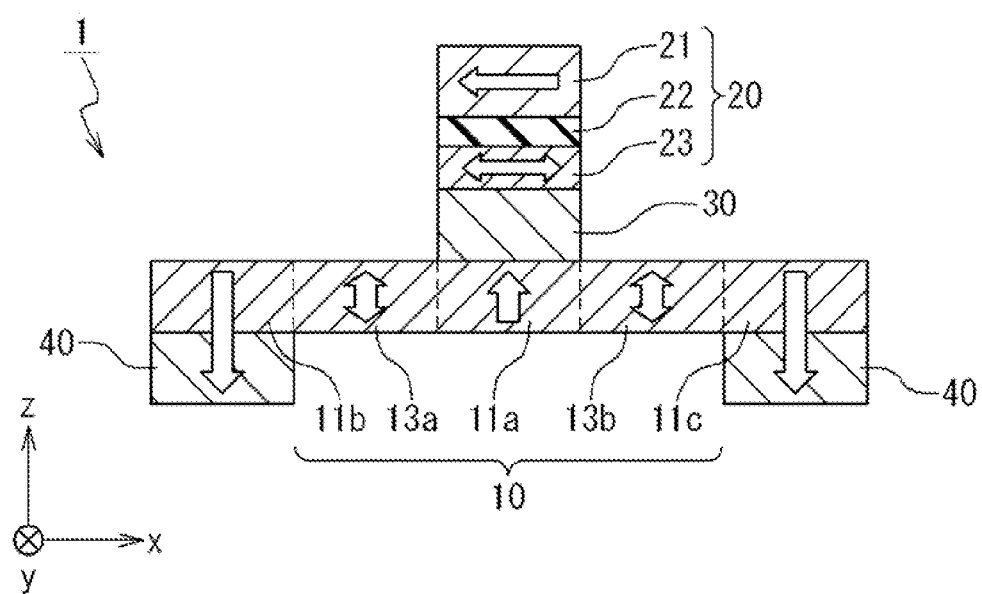
FIG. 12 is a structural diagram showing an example of the sensor layer of the magnetic memory element according to the embodiment of the present invention.
Figure 13:
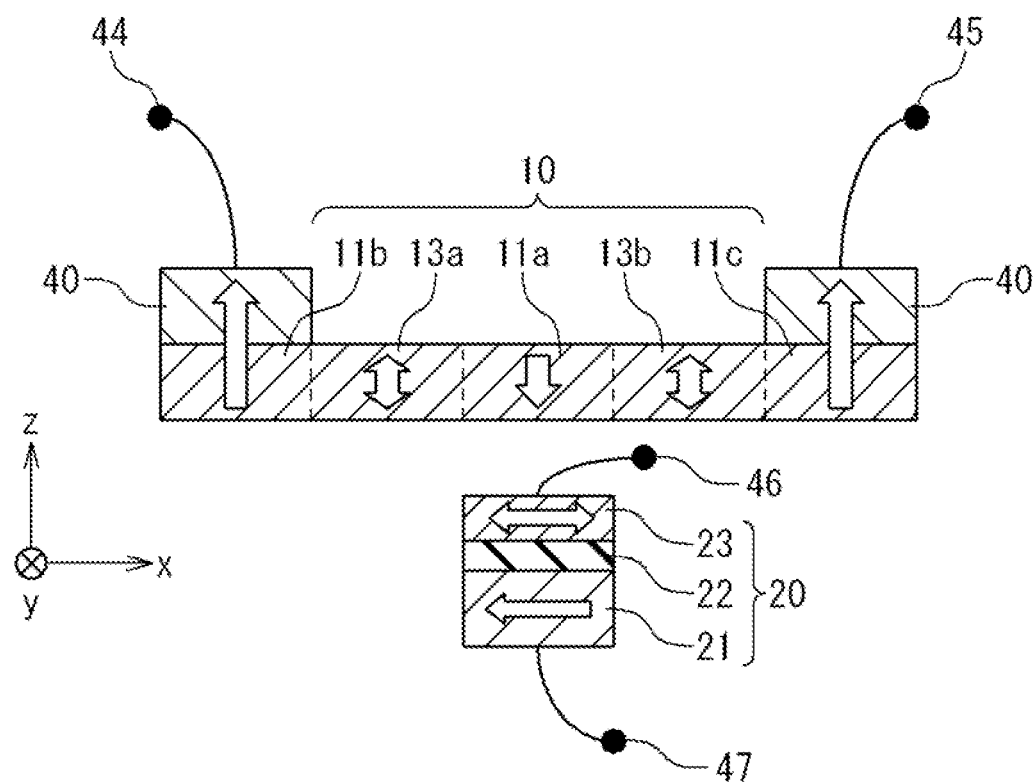
FIG. 13 is a structural diagram showing an example of the sensor layer of the magnetic memory element according to the embodiment of the present invention.
Figure 14:
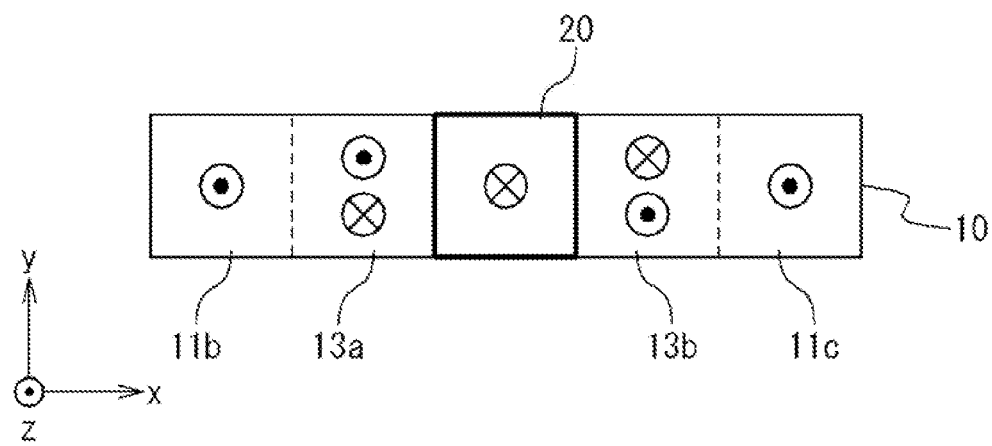
FIG. 14 is a structural diagram showing an example of the sensor layer of t he magnetic memory element according to the embodiment of the present invention.
Figure 15:
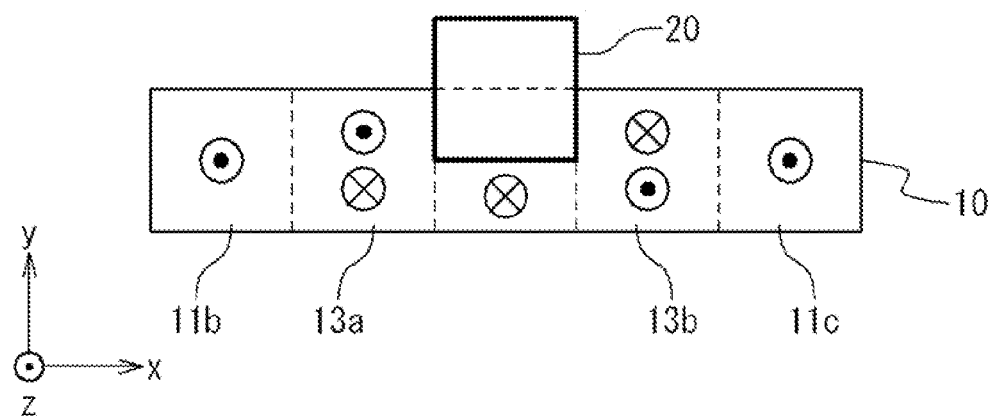
FIG. 15 is a structural diagram showing an example of the sensor layer of the magnetic memory element according to the embodiment of the present invention.
Figure 16:
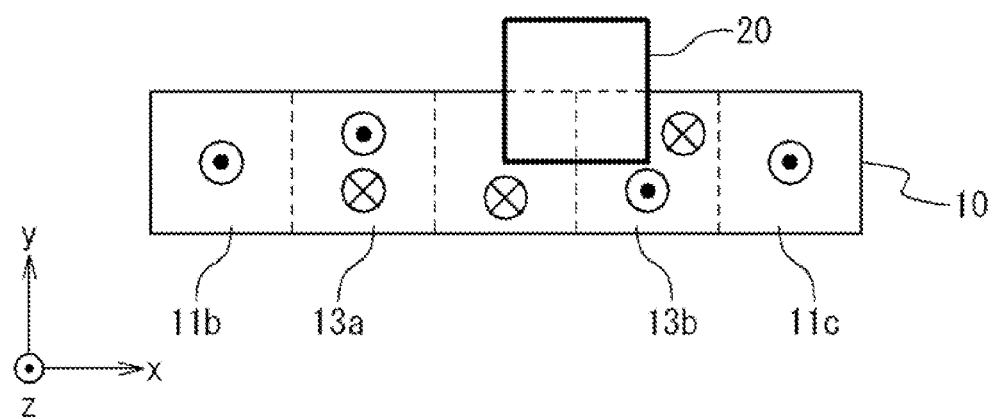
FIG. 16 is a structural diagram showing an example of the sensor layer of the magnetic memory element according to the embodiment of the present invention.

FIGS. 11 to 16 are structural diagrams showing variations of positions of the sensor layer 23 of the magnetic memory element according to the embodiment of the present invention. Here, FIGS. 11 to 13 are sectional views and FIGS. 14 to 16 are plan views.

FIG. 11 shows the case indicated in FIGS. 9A to 8B, the sensor layer 23 is arranged under the magnetization recording layer 10 (−z direction side) through the contact layer 30. Here, if the magnetic field generated by the first domain wall moving area 13*a* and the second domain wall moving area 13*b* can switch the magnetization direction of the sensor layer 23, the magnetic tunneling junction section 20 may be arranged upside down, that is, the reference layer 21 may be in contact with the contact layer 30 (not shown).

As shown in FIG. 12, the sensor layer 23 may be arranged above the magnetization recording layer 10 (+z direction side) through the contact layer 30. Here, if the magnetic field generated by the first domain wall moving area 13*a* and the second domain wall moving area 13*b* can switch the magnetization direction of the sensor layer 23, the magnetic tunneling junction section 20 may be arranged upside down, that is, the reference layer 21 may be in contact with the contact layer 30 (not shown).

As shown in FIG. 13, if the magnetic field generated by the first domain wall moving area 13*a* and the second domain wall moving area 13*b* can switch the magnetization direction of the sensor layer 23, the magnetic memory element 1 may have the structure that the contact layer 30 is not provided and the sensor layer 23 is not electrically connected to the magnetization recording layer 10. In this case, current supplying terminals 44 and 45 for the writing current are provided both ends of the magnetization recording layer 10 and current supplying terminals 46 and 47 for the reading are differently provided both ends of the magnetic tunneling junction section 20.

In addition, in the case of the configurations described in FIGS. 11 to 13, any of the cases described in FIGS. 14 to 16 is considered. FIG. 14 shows the case indicated in FIGS. 4A to 8B, the sensor layer 23 is arranged just under (−z direction side) or just above (+z direction side) the zero-th magnetization fixed area 11*a* of the magnetization recording layer 10. That is, a projection of the sensor layer 23 on the magnetization recording layer 10 overlaps with the zero-th magnetization fixed area 11*a*. This configuration is preferable because the magnetic field generated by the first domain wall moving area 13*a* and the second domain wall moving area 13*b* can switch the magnetization of the sensor layer 23 in more stable manner.

As shown in FIG. 15, if the magnetic field generated by the first domain wall moving area 13*a* and the second domain wall moving area 13*b* can switch the magnetization direction of the sensor layer 23, the sensor layer 23 may be provided at the back side (+y direction side) or the front side (−y direction side) of the zero-th magnetization fixed area 11*a* of the magnetization recording layer 10. At that time, a projection of the sensor layer 23 on the magnetization recording layer 10 preferably overlaps with at least a part of an area between the first domain wall moving area 13*a* and the second domain wall moving area 13*b* in the magnetization recording layer 10. Such an area includes a part of the zero-th magnetization fixed area 11*a*, and may further include at least one of a part of the first domain wall moving area 13*a* and a part of the second domain wall moving area 13*b*.

As shown in FIG. 16, if the magnetic field generated by the first domain wall moving area 13*a* and the second domain wall moving area 13*b* can switch the magnetization direction of the sensor layer 23, the sensor layer 23 may be provided at, the back side (+y direction side) or the front side (−y direction side), and, the left side (−x direction side) or the right side (+x direction side), of the zero-th magnetization fixed area 11*a* of the magnetization recording layer 10. At that time, a projection of the sensor layer 23 on the magnetization recording layer 10 preferably overlaps with at least a part of an area between the first domain wall moving area 13*a* and the second domain wall moving area 13*b* in the magnetization recording layer 10. Such an area includes a part of the zero-th magnetization fixed area 11*a*, and further include at least one of a part of the first domain wall moving area 13a and a part of the second domain wall moving area 13b.

As described above, in the present embodiment, the positional relation between the sensor layer 23 and the magnetization recording layer 10 only has to be a positional relation that the magnetic field generated by the first domain wall moving area 13a and the second domain wall moving area 13b can switch the magnetization direction of the sensor layer 23. Therefore, there is a lot of flexibility.

8. Positional Relation between Sensor Layer and Hard Layers

Figure 17:
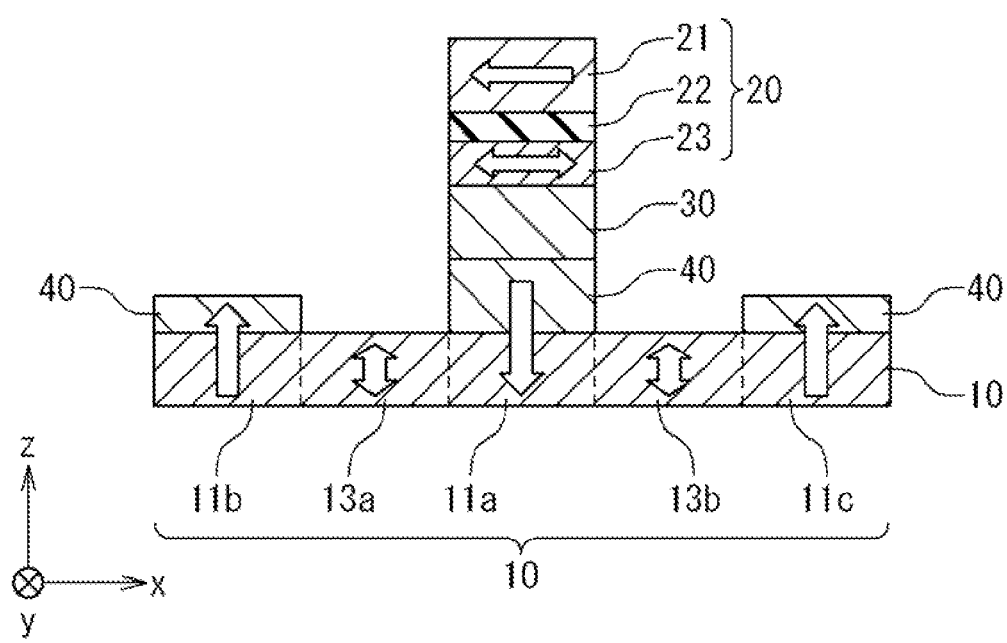
FIG. 17 is a structural diagram showing a variation for a positional relation between the sensor layer and hard layers of the magnetic memory element according to the embodiment of the present invention.

FIG. 17 is a structural diagram showing a variation for a positional relation between the sensor layer and the hard layers of the magnetic memory element according to the embodiment of the present invention. Here, FIG. 17 is a sectional view.

In the present embodiment, there is arbitrariness in the positional relation of the sensor layer 23 and the hard layers 40 with respect to the magnetization recording layer 10. For example shown in FIG. 4B, the sensor layer 23 may be arranged under (−z side) the magnetization recording layer 10 and the hard layers 40 may be arranged above (+z sides) the magnetization recording layer 10. In addition, as shown in FIG. 12, the sensor layer 23 may be arranged above (+z side) the magnetization recording layer 10 and the hard layers 40 may be arranged under (−z sides) the magnetization recording layer 10. Further, as shown in FIG. 17, the sensor layer 23 may be arranged above (+z side) the magnetization recording layer 10 and the hard layers 40 may be also arranged above (+z side) the magnetization recording layer 10. As described above, according to the present invention, there is no limitation to the positional relation of the sensor layer 23 and the hard layers 40 if the hard layers 40 can realize the predetermined magnetization structure of the magnetization recording layer 10 and if the sensor layer 23 can read the magnetization directions of the first domain wall moving area 13a and the second domain wall moving area 13b.

Here, to realize the predetermined magnetization structure by introducing the domain walls in the magnetization recording layer 10, the hard layers 40 are preferably arranged on the upper surface of the magnetization recording layer 10. The reason is as follows. In the case of the structure that the hard layers 40 are arranged on the upper surface of the magnetization recording layer 10, since the film for the magnetization recording layer 10 and the film for the hard layers 40 can be continuously deposited, the strong exchange-coupling can be obtained between the magnetization recording layer 10 and the hard layers 40.

In the viewpoint of the layout of the element, the magnetic tunneling junction section 20 for the reading is preferably arranged above (+z side) the magnetization recording layer 10. The reason is as follows. The writing current is required to be supplied to the magnetization recording layer 10 through the transistor. The writing current is supplied from the lower side (−z side) of the magnetic memory element 1. Therefore, the wiring line for the reading is preferably arranged above (+z side) the magnetic memory element 1. When the wiring line for the reading is arranged above (+z side) the magnetic memory element 1, the magnetic memory cells can be laid out such that the cell area is minimized.

Consequently, according to the above-mentioned viewpoint, it is the most preferable that the embodiment shown in FIG. 17 in which both of the hard layer 40 and the sensor layer 23 are arranged above (+z side) the magnetic recording layer 10 in the light of the initialization of the magnetic memory element 1 and the easiness of the layout.

Incidentally, to initialize the memory sate of the magnetic memory element 1 more easily, the hard layer 40 is preferably formed as shown below. As mentioned above, in the present embodiment, the magnetization directions of the first magnetization fixed area 11b and the second magnetization fixed area 11c are fixed so as to be parallel to each other, and the magnetization direction of the zero-the magnetization fixed area 11a is fixed so as to be anti-parallel to them. Therefore, it is preferable that the magnetic properties of the hard layers 40 adjacent to the first magnetization fixed area 11b and the second magnetization fixed area 11c are different from the magnetic properties of the hard layer 40 adjacent to the zero-th magnetization fixed area 11a. For example, the differences of the magnetic properties can be provided by forming the layers with the thicknesses different from each other. For example, as shown in FIG. 17, when the thicknesses of the hard layers 40 adjacent to the first magnetization fixed area 11b and the second magnetization fixed area 11c are thinner than the thickness of the hard layer 40 adjacent to the zero-th magnetization fixed area 11a, it can be easy to initialize the magnetization recording layer 10 such that the magnetization recording layer 10 has the predetermined magnetization structure.

9. Method of Stopping Domain Wall

Figure 18:
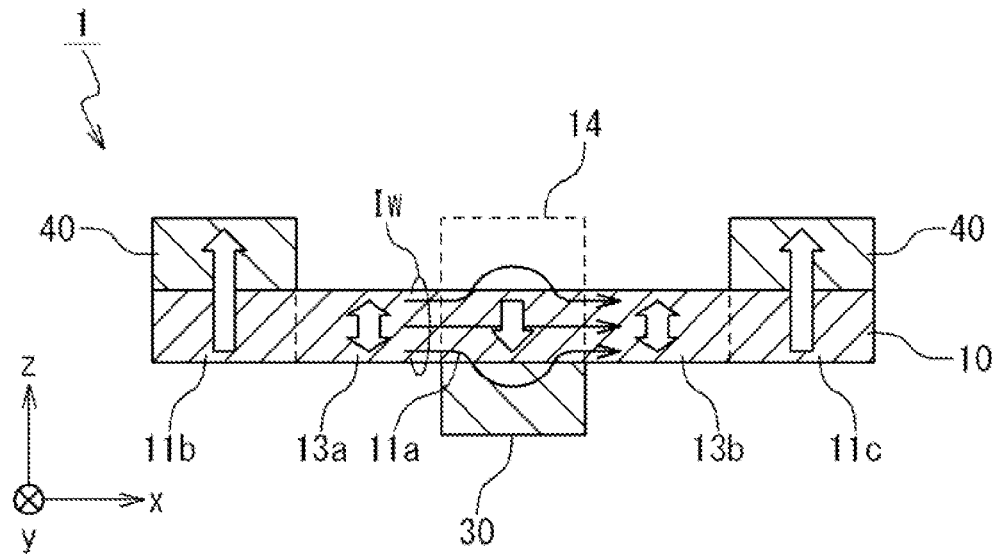
FIG. 18 is a structural diagram showing an example of a method of stopping a domain wall according to the embodiment of the present invention.
Figure 19A:
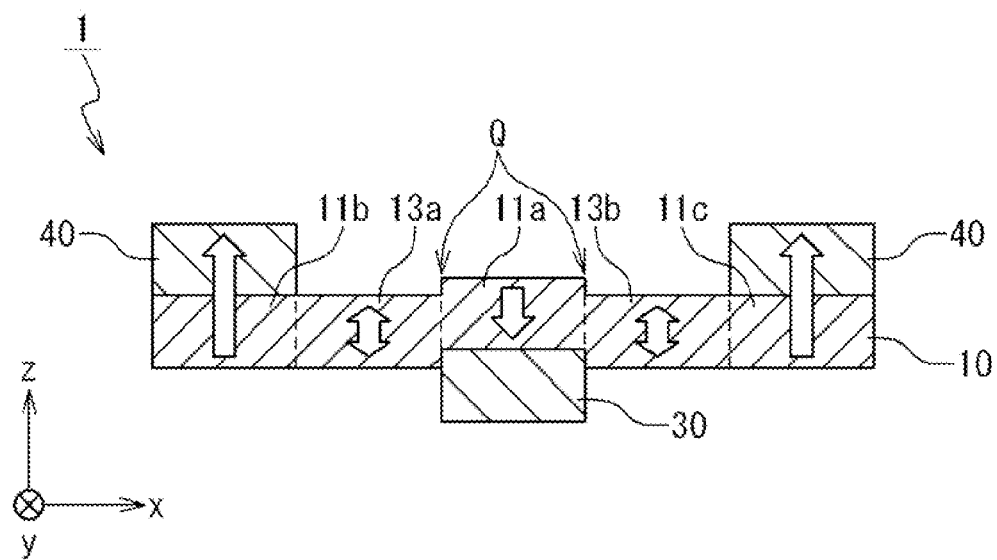
FIG. 19A is a structural diagram showing an example of the method of stopping the domain wall according to the embodiment of the present invention.
Figure 19B:
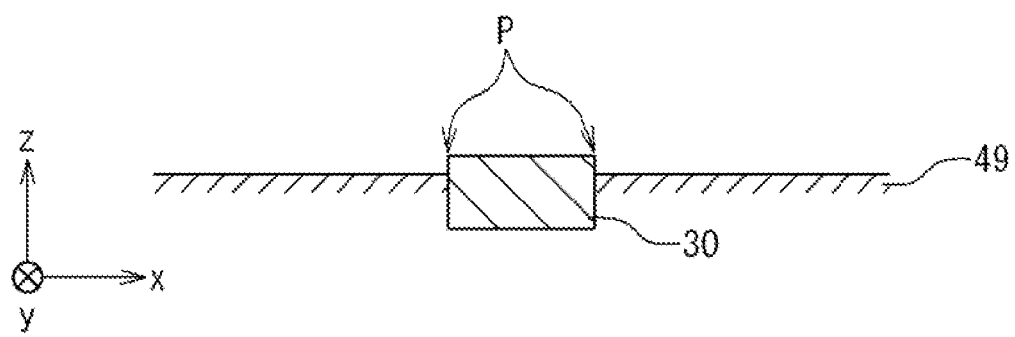
FIG. 19B is a structural diagram showing an example of the method of stopping the domain wall according to the embodiment of the present invention.
Figure 19C:
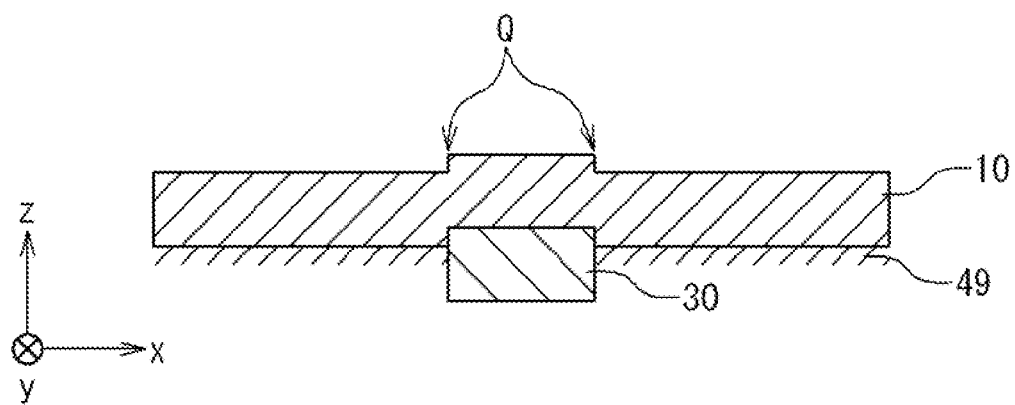
FIG. 19C is a structural diagram showing an example of the method of stopping the domain wall according to the embodiment of the present invention.
Figure 20:
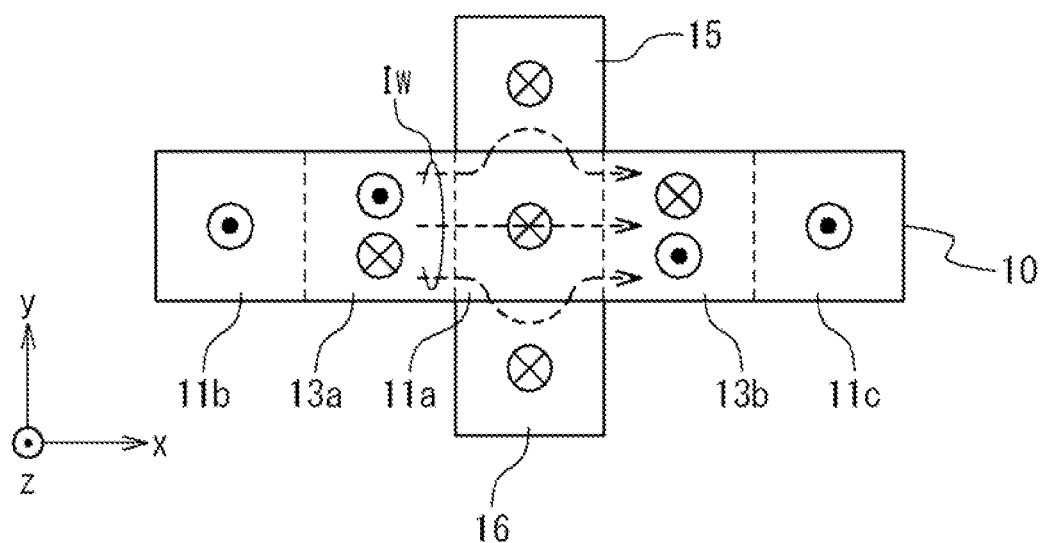
FIG. 20 is a structural diagram showing an example of the method of stopping the domain wall according to the embodiment of the present invention.
Figure 21:
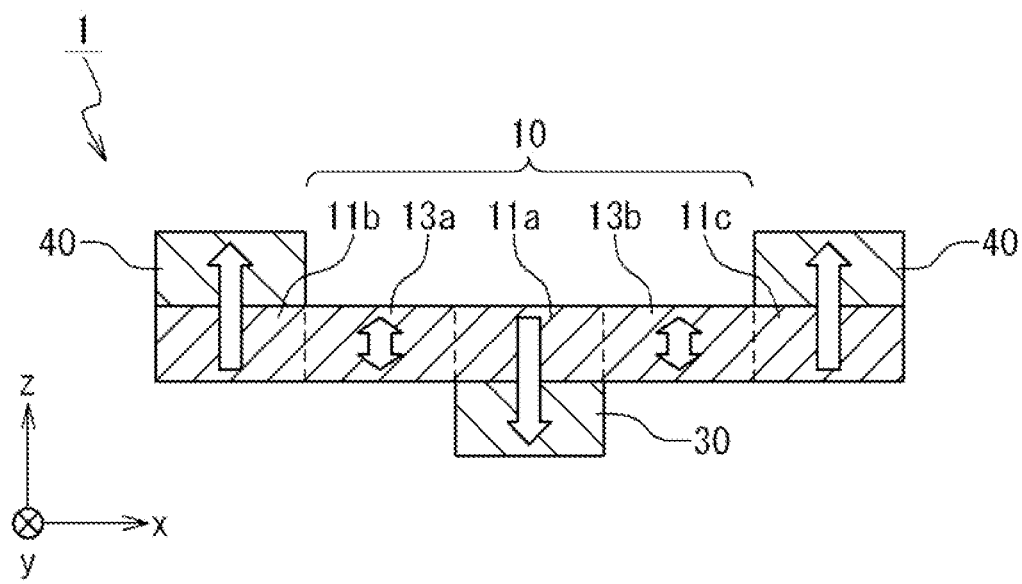
FIG. 21 is a structural diagram showing an example of the method of stopping the domain wall according to the embodiment of the present invention.
Figure 22:
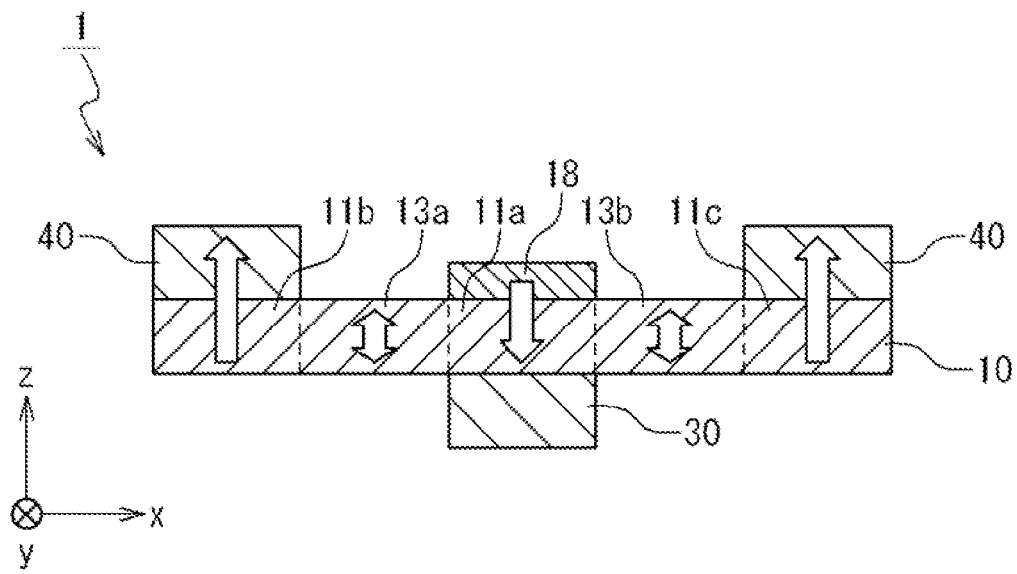
FIG. 22 is a structural diagram showing an example of the method of stopping the domain wall according to the embodiment of the present invention.
Figure 23:
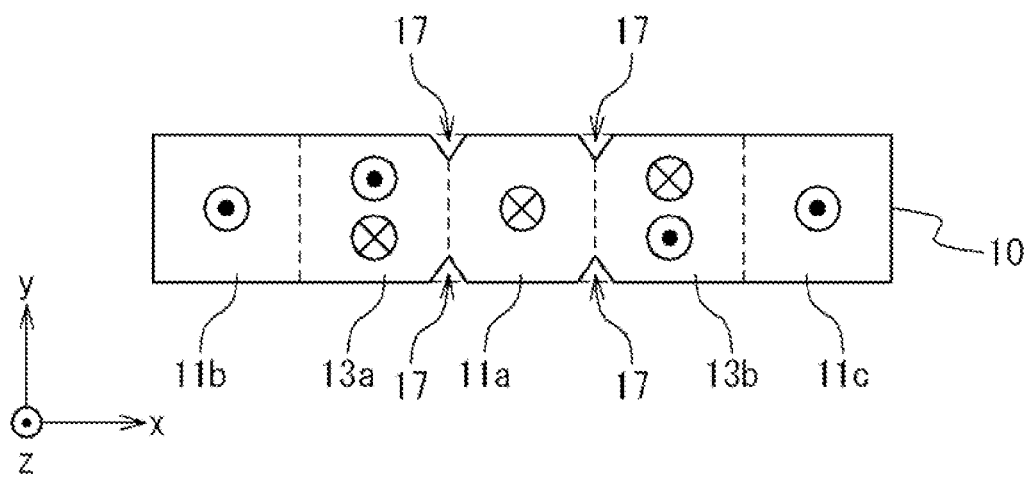
FIG. 23 is a structural diagram showing an example of the method of stopping the domain wall according to the embodiment of the present invention.

FIGS. 18 to 23 are structural diagrams showing examples of a method of stopping domain walls at both ends of the zero-th magnetization fixed area 11a of the magnetic memory element according to the embodiment of the present invention. In each drawing, the magnetic tunneling junction section 20 is omitted. FIGS. 18, 19A to 19C, 21, and 22 are sectional views, and FIGS. 20 and 23 are plane views.

FIG. 18 is an example of the method of stopping domain walls. Two methods can be considered.

In the first method, material having a low resistance value as compare with the material of the zero-th magnetization fixed area 11a is used as the material of the contact layer 30. For example of the material, Au, Ag, Cu, Al, Ru, Pt, Pd and the like are exemplified. In this case, the writing current Iw flowing through the first domain wall moving area 13a (or the second domain wall moving area 13b) not only flows in the zero-th magnetization fixed area 11a, but also flows into the contact layer 30 in large quantity. That is, the writing current Iw flows in the zero-th magnetization fixed area 11a and in the contact layer 30, separately. Here, since total quantity of the writing current Iw is not changed, the current density in the zero-th magnetization fixed area 11a becomes decreased. However, a current density equal to or more than a threshold value is required to carry out the domain wall motion. For example of FIG. 18, the current density of the writing current Iw is set to be equal to or more than the above-mentioned threshold value in the first domain wall moving area 13a (or the second domain wall moving area 13b), and to be less than the above-mentioned threshold value in the zero-th magnetization fixed area 11a due to the current separation. Therefore, the domain wall is moved in the first domain wall moving area 13a (or the second domain wall moving area 13b) in which the current density is equal to or more than the threshold value, and is stopped near the end portion of the zero-th magnetization fixed area 11a in which the current density is less than the threshold value.

In the second method, material in which spin scattering can easily arise is used as the material of the contact layer 30. For example of the material, Pt, Pd, and the like are exemplified. In this case, the writing current Iw flowing through the first domain wall moving area 13a (or the second domain wall moving area 13b) not only flows in the zero-th magnetization fixed area 11a, but also flows into the contact layer 30. That is, the writing current Iw (electrons) flows in the zero-th magnetization fixed area 11a and in the contact layer 30, separately. At that time, electrons flowing into the contact layer 30 are spin-scattered in the contact layer 30, and a part of the spin-scattered electrons returns to the zero-th magnetization fixed area 11a. As a result, spins of electrons in the zero-th magnetization fixed area 11a are disturbed based on the influence of the spin-scattered electrons to be random, and cannot move the domain wall. For example of FIG. 18, spins of electrons are uniform in the second domain wall moving area 13b (or the first domain wall moving area 13a), and are not uniform in the zero-th magnetization fixed area 11a due to the disturbance. Therefore, the domain wall is moved in the second domain wall moving area 13b (or the first domain wall moving area 13a) in which spins of electrons are uniform, and is stopped near the end portion of the zero-th magnetization fixed area 11a in which spins of electrons are disturbed.

Incidentally, even though the stopping method is realized by using the material which has a low resistance value or the material in which spin scattering can easily arise as the contact layer 30 arranged at the lower side (−z direction side) of the zero-th magnetization fixed area 11a in FIG. 18, the present invention is not limited to this example. That is, if an assistance layer 14, which is formed of the material which has a low resistance value or the material in which spin scattering can easily arise, is arranged on the periphery of and adjacent to the zero-th magnetization fixed area 11a, the contact layer 30 may be omitted or the position of the contact layer 30 may be arbitrary. FIG. 18 shows an example in which the assistance layer 14 (shown with dashed line) is arranged at the upper side (+z direction side) of the zero-th magnetization fixed area 11a. This case can also obtain the effect similar to the cases using the contact layer 30 shown in the above two methods. The method shown in FIG. 18 does not require a special manufacturing process and can be realized only by selecting the material of the contact layer 30, thereby enabling the process to be easy.

FIGS. 19A to 19C showing another example of the method of stopping the domain wall. The method shown in FIG. 19A, steps Q are intentionally provided at both ends of the zero-th magnetization fixed area 11a of the magnetization recording layer 10. Therefore, a surface of the upper side (+z direction side) of the zero-th magnetization fixed area 11a is protruded rather than surfaces of the upper sides of the first magnetization fixed area 11b, the first domain wall moving area 13a, the second domain wall moving area 13b, and the second magnetization fixed area 11c. As a result, the steps Q are formed at a boundary between the zero-th magnetization fixed area 11a and the second domain wall moving area 13b, and, a boundary between the zero-th magnetization fixed area 11a and the first domain wall moving area 13a. These steps Q function as pin potentials with respect to the domain walls and can stop the domain walls at their positions.

Incidentally, even though the example of FIG. 19A shows the steps convex to the upper side (+z direction side), the steps may be concave to the upper side (convex to the lower side (−z direction side)). In addition, even though FIG. 19A indicates that a part of the contact layer 30 is protruded from a bottom surface at the lower side of the magnetization recording layer 10, a part of the contact layer 30 may not be protruded from a bottom surface at the lower side of the magnetization recording layer 10.

As shown in FIG. 19B, in the manufacturing process, the contact layer 30 is formed by depositing a film such as a metal film in an interlayer insulating layer 49 having a hole such as a via hole and polishing it using the CMP method. In the polishing by the CMP method, it is definitely difficult to avoid forming steps P between the surface of the interlayer insulating layer 49 and the surface of the contact layer 30 according to the process property. Consequently, in the example of FIG. 19A, the steps P are willingly used. That is, as shown in FIG. 19C, a film for the magnetization recording layer 10 is deposited such that the interlayer insulating layer 49 and the contact layer 30 with the remaining steps P are covered with the film. In doing so, the steps Q are formed in the film by the influence of the steps P of the contact layer 30. Therefore, by shaping the magnetization recording layer 10 from the film, the shape shown in FIG. 19A can be obtained. Incidentally, such steps may be provided at the first magnetization fixed area 11b and the second magnetization fixed area 11c of both ends of the magnetization recording layer 10 to fix domain walls. This method does not require a special manufacturing process and can be easily realized.

FIG. 20 shows still another example of the method of stopping the domain wall.

In the method shown in FIG. 20, the section area of the zero-th magnetization fixed area 11a is increased (e.g., enlarging the thickness and/or width) such that the current density in the zero-th magnetization fixed area 11a is reduced less than the threshold value necessary for driving domain wall. In this case, the writing current Iw flowing through the first domain wall moving area 13a (or the second domain wall moving area 13b) flows in the zero-th magnetization fixed area 11a of which the section area is increased. Here, the total quantity of the writing current is not changed. Therefore, the current density in the zero-th magnetization fixed area 11a is reduced. For example of FIG. 20, the width of the zero-th magnetization fixed area 11a is enlarged by the widths of protruding portions 15 and 16 in ±y directions. The current density of the writing current Iw is set to be equal to or more than the above-mentioned threshold value in the first domain wall moving area 13a (or the second domain wall moving area 13b), and set to be less than the above-mentioned threshold value in the zero-th magnetization fixed area 11a due to the reduction. Therefore, the domain wall is moved in the first domain wall moving area 13a (or the second domain wall moving area 13b) in which the current density is equal to or more than the threshold value, and is stopped near the end portion of the zero-th magnetization fixed area 11a in which the current density is less than threshold value.

Incidentally, in FIG. 20, even though the width of the zero-th magnetization fixed area 11a is enlarged in the ±y directions, the present invention is not limited to this example. That is, if the section area of the zero-th magnetization fixed area 11a can be enlarged, the width may be enlarged in any of +y direction and −y direction, in +z direction, or in −z direction. In this case, the effect similar to the case of FIG. 20 can be obtained. This method does not require a special manufacturing process and can be easily realized, except for changing a part of the pattern of the magnetization recording layer 10.

FIG. 21 shows yet still another example of the method of stopping the domain wall.

In the method shown in FIG. 21, the contact layer 30 is formed of the perpendicular magnetic anisotropy material similar to the zero-th magnetization fixed area 11a and the magnetization direction thereof is the same as the zero-th magnetization fixed area 11a. In doing so, the magnetization of the zero-th magnetization fixed area 11a is increased. Thus, the domain wall motion can be suppressed. As a result, the domain wall moving through the first domain wall moving area 13a (or the second domain wall moving area 13b) in which the magnetization is relatively small stops at the end portion of the zero-th magnetization fixed area 11a in which the magnetization is large. This method does not require a special manufacturing process and can be realized only by selecting the material of the contact layer 30, thereby enabling the process to be easy.

FIG. 22 shows yet still another example of the method of stopping the domain wall.

In the method shown in FIG. 22, a hard layer (second hard layer 18) is arranged on the zero-th magnetization fixed area 11a similar to the first magnetization fixed area 11b and the second magnetization fixed area 11c. Here, the hard layer 18 is not hard (low coercivity) as compared with the hard layer 40 to enable the above-mentioned initialization method to be used. In this case, since the magnetization of the zero-th magnetization fixed area 11a is increased, the domain wall motion can be suppressed. As a result, the domain wall moving through the first domain wall moving area 13a (or the second domain wall moving area 13b) in which the magnetization is relatively small stops at the end portion of the zero-th magnetization fixed area 11a in which the magnetization is large.

FIG. 23 shows yet still another example of the method of stopping the domain wall.

In the method shown in FIG. 23, pin sites, which function as pin potentials, such as notches 17 are arranged at a boundary portion between the zero-th magnetization fixed area 11a and the first domain wall moving area 13a and a boundary portion between the zero-th magnetization fixed area 11a and the second domain wall moving area 13b. Even though it will be difficult to manufacture these pin sites according to the miniaturization of the magnetization recording layer 10, this method can be used if the size of the magnetization is relatively large. Consequently, since the notches 17 function as the pin potentials, the domain walls can be stopped at their positions.

The stopping methods described above can be applied to not only the stop of the domain walls at the boundaries between the zero-th magnetization fixed area and the first and second domain wall moving areas, but also the stop of the domain walls at the boundary between the first magnetization fixed area and the first domain wall moving area and the boundary between the second magnetization fixed area and the second domain wall moving area.

10. Method of Fixing Magnetization

FIGS. 24 to 28 are structural diagrams showing variations of a method of fixing magnetizations of the first magnetization fixed area and the second magnetization fixed area of the magnetic memory element according to the embodiment of the present invention. In each drawing, the magnetic tunneling junction section 20 is omitted. FIGS. 24 to 26, 27B, and 28 are sectional views, and FIG. 27A is a plane view.

FIG. 24 shows an example of the method of fixing the magnetization.

In the example shown in FIGS. 4A to 8B, the first hard layers 40 are arranged on the upper side (+z direction side) of the first magnetization fixed area 11b and the second magnetization fixed area 11c. However, as shown in FIG. 24, the first hard layers 40 may be arranged on the lower side (−z direction side) of the first magnetization fixed area 11b and the second magnetization fixed area 11c. This method is preferable when the first hard layers 40 are desired to be arranged on the lower side due to the manufacturing process or the like.

FIG. 25 shows another example of the method of fixing the magnetization.

In the example shown in FIG. 25, the first hard layers 40 may be arranged on the upper side (+z direction side) and the lower side (−z direction) of the first magnetization fixed area 11b and the second magnetization fixed area 11c. This method is preferable when the first hard layers 40 with thin film thicknesses are arranged on the upper side and the lower side because thick hard layers cannot be provided one of the upper side and the lower side due to the manufacturing process or the like, or when the magnetizations of the first magnetization fixed area 11b and the second magnetization fixed area 11c is strongly fixed.

FIG. 26 shows still another example of the method of fixing the magnetization.

In the example shown in FIG. 26, the first hard layers 40 are not required to be directly connected to the first magnetization fixed area 11b and the second magnetization fixed area 11c if the first hard layers 40 are magnetically coupled to the first magnetization fixed area 11b and the second magnetization fixed area 11c. That is, the first hard layer 40 are arranged near at least one of the upper side and the lower side of the first magnetization fixed area 11b and the second magnetization fixed area 11c such that the first hard layers 40 can be magnetically coupled to the first magnetization fixed area 11b and the second magnetization fixed area 11c. The example of FIG. 26, the first hard layers 90 are arranged through other intermediate layers 43 under the first magnetization fixed area 11b and the second magnetization fixed area 11c. This method is preferable when the first hard layers 40 cannot be arranged directly on the magnetization recording layer 10 due to the manufacturing process or the like.

Figure 27A:
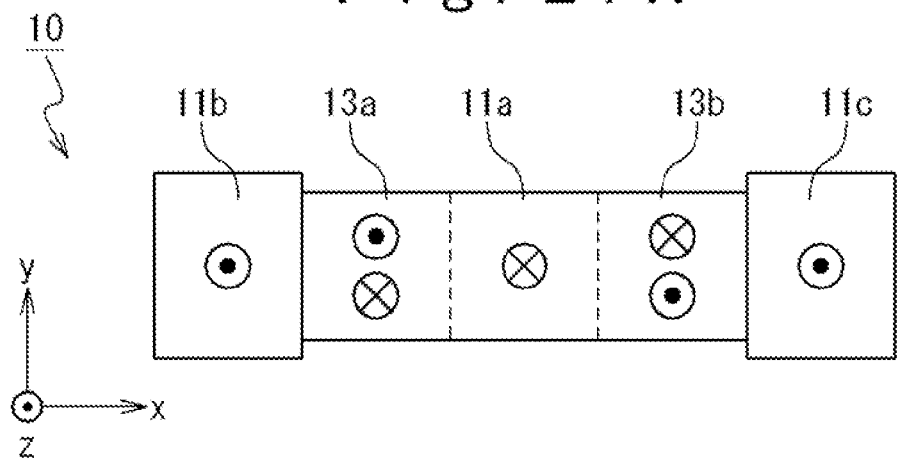
FIG. 27A is a structural diagram showing an example of the method of fixing the magnetization according to the embodiment of the present invention.

FIGS. 27A (plan view) and 27B (section view) show yet still another example of the method of fixing the magnetization.

Figure 27B:
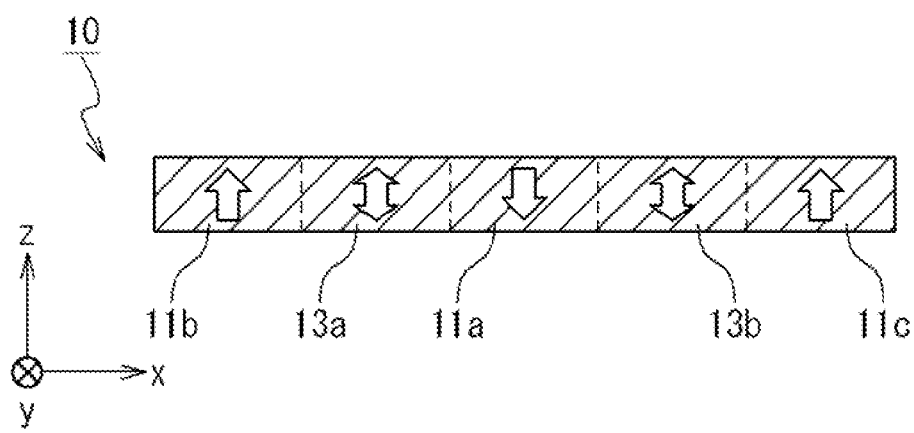
FIG. 27B is a structural diagram showing an example of the method of fixing the magnetization according to the embodiment of the present invention.

As shown in FIGS. 27A and 27B, a desired magnetization state can be provided by devising the shape instead of using of the first hard layer. For example of FIGS. 27A and 27B, the width of the first magnetization fixed area 11b near the boundary between the first magnetization fixed area 11b and the first domain wall moving area 13a, and the width of the second magnetization fixed area 11c near the boundary between the second magnetization fixed area 11c and the second domain wall moving area 13b are larger than the widths of the first domain wall moving area 13a and the second domain wall moving area 13b. As a result, it is difficult for the domain wall to enter the first magnetization fixed area 11b and the second magnetization fixed area 11c, and the boundaries function as the pin potentials with respect to the domain walls. That is, the magnetization of the first magnetization fixed area 11b and the second magnetization fixed area 11c are fixed. Since this method does not require the first hard layers, but requires only the shape change of the magnetization recording layer 10, the manufacturing process is made to be simplified, thereby enabling to reduce the manufacturing costs.

Figure 28:
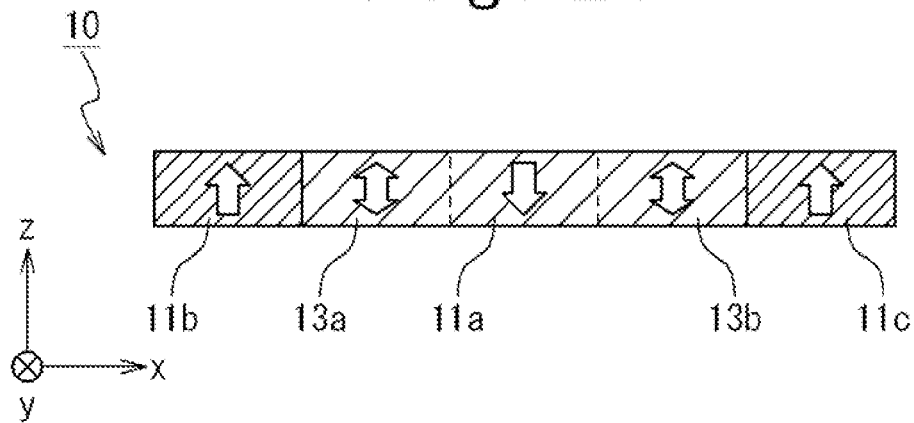
FIG. 28 is a structural diagram showing an example of the method of fixing the magnetization according to the embodiment of the present invention.

FIG. 28 shows yet still another example of the method of fixing the magnetization.

As shown in FIG. 28, a desired magnetization state can be provided by devising the material instead of using of the first hard layer. For example of FIG. 28, material, which is different from the material of the first domain wall moving area 13a and the second domain wall moving area 13b, is used as the material of the first magnetization fixed area 11b and the second magnetization fixed area 11c. Material having coercivity relatively high is exemplified as such material. It can be also realized by performing the ion-implantation on the first magnetization fixed area 11b and the second magnetization fixed area 11c to change their magnetic properties.

11. Anisotropy of Sensor Layer

Figure 29:
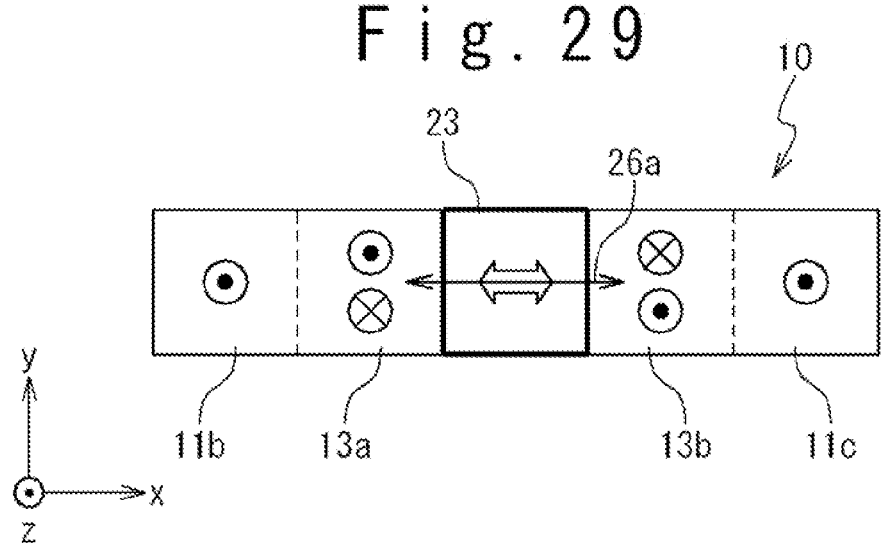
FIG. 29 is a plan view showing an example of a magnetic anisotropy direction of the sensor layer according to the embodiment of the present. invention.
Figure 30:
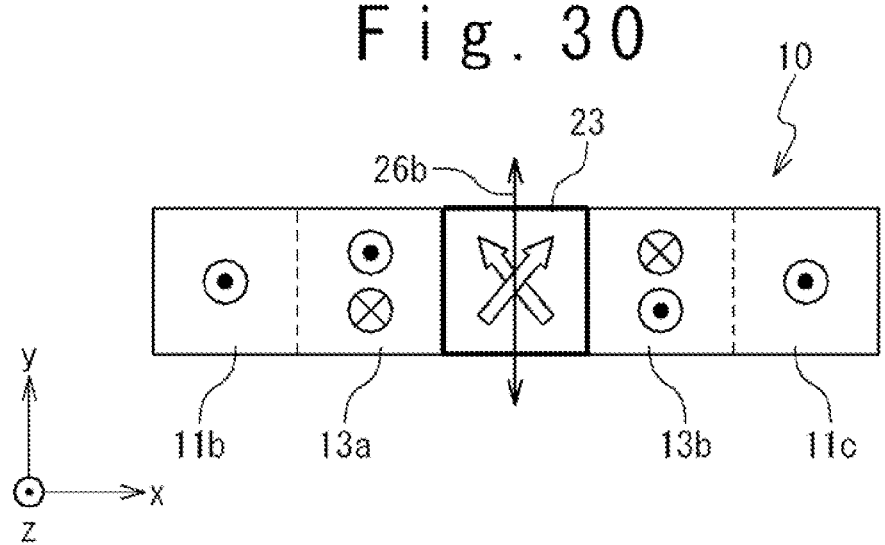
FIG. 30 is a plan view showing an example of a magnetic anisotropy direction of the sensor layer according to the embodiment of the present invention.

FIGS. 29 to 30 are plan views showing variations of a magnetic anisotropy direction of the sensor layer of the magnetic memory element according to the embodiment of the present invention. The solid arrow in FIG. 29 shows a magnetization easy axis direction 26a of the reference layer 21, and the solid arrow in FIG. 30 shows a magnetization hard axis direction 26b of the reference layer 21.

The sensor layer 23 is formed of the material with the in-plane magnetic anisotropy. Here, the magnetic anisotropy direction of the sensor layer 23 may be the in-plane ±x direction (FIG. 29) or may be the in-plane ±y direction (FIG. 30). The magnetic anisotropy of the sensor layer 23 may be provided by it shape (shape magnetic anisotropy), may be provided by its crystal structure (crystal magnetic anisotropy), or may be provided by its stress (stress-induced magnetic anisotropy) adjusting proper magnetostriction.

In the x direction shown in FIG. 29, the operation of switching the magnetization of the sensor layer 23 is an easy axis operation. The maximum MR ratio can be obtained. However, if the leakage magnetic field from the magnetization recording layer 10 (the first domain wall moving area 13a and the second domain wall moving area 13b) is small, there is a possibility that the switching becomes difficult. On the other hand, in the y direction shown in FIG. 30, the operation of switching the magnetization of the sensor layer 23 is a hard axis operation. Even if the leakage magnetic field from the magnetization recording layer 10 (the first domain wall moving area 13a and the second domain wall moving area 13b) is small such that the magnetization cannot be switched by the easy axis operation, the data can be written (the switching can be performed). However, the MR ratio is relatively low and relatively fluctuated.

12. Reference Cell

Figure 31:
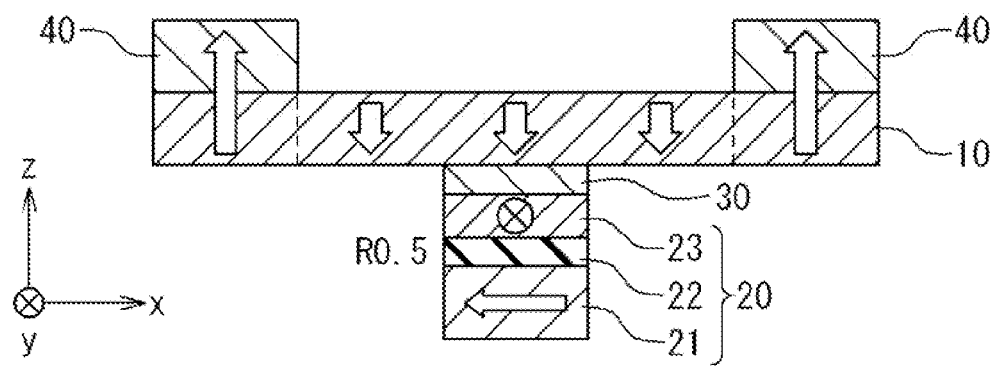
FIG. 31 is a sectional view showing a structure of a magnetic memory element in a reference cell of the MRAM according to the embodiment of the present invention.

FIG. 31 is a sectional view showing a structural example of a magnetic memory element in the reference cell of the MRAM according to the embodiment of the present invention. The basic structure of the magnetic memory element of the reference cell is the same as that of the usual magnetic memory element as described in the explanation of FIG. 10. Here, for example of FIG. 31, as similar to FIG. 30, the magnetic anisotropy direction of the sensor layer 23 is the ±y direction (the hard axis operation). In this case, the magnetic resistance of the MTJ of the magnetic tunneling junction section 20 of the reference cell is the resistance value R0.5 (the middle value between the resistance value R0 and the resistance value R1). By using this value as the reference level, the following merits can be obtained.

In the reading operation of the MRAM 90 (FIG. 10), when two columns are assigned to the reference cells 80r as one column is set to the resistance value R0 and another column is set to the resistance value R1, for example, the reference level of the middle resistance value R0.5 is prepared by using an average value of the resistance value R0 and the average value of the resistance value R1 for the data reading. In this case, it is necessary to write "1" and "0" to the reference cells 80r after the MRAM manufacturing. By writing "1" and "0", the magnetization of the sensor layer is directed in the predetermined direction. However, the directions of the reference layers include some variability. Therefore, the setting of the reference level of the reference cells 80r storing the resistance value R0 and the resistance value R1 includes some inaccuracy. In addition, the memory cells 80 storing "1" and "0" also include some variability. Consequently, in combination of the variability of the memory cells 80 and the variability of the reference cells 80r, the accurate data reading is considered to be difficult.

However, in the reading operation of the MRAM 90 (FIG. 10), when one column is assigned to the reference cells and the reference cells 80r are set to the resistance value R0.5 as shown in FIG. 31, even if the resistance values R0 and the resistance values R1 of the magnetic memory elements in the memory cells 80 include some variability, the reference cells 80r are certainly set to the resistance value R0.5. Therefore, the reference cell level does not include any variability and is definitely set. That is, even if the magnetic anisotropy of the magnetic memory element includes some variability, the reference level as the reference is accurate, thereby enabling whether the resistance value is R0 or R1 to be accurately determined (read).

Figure 32:
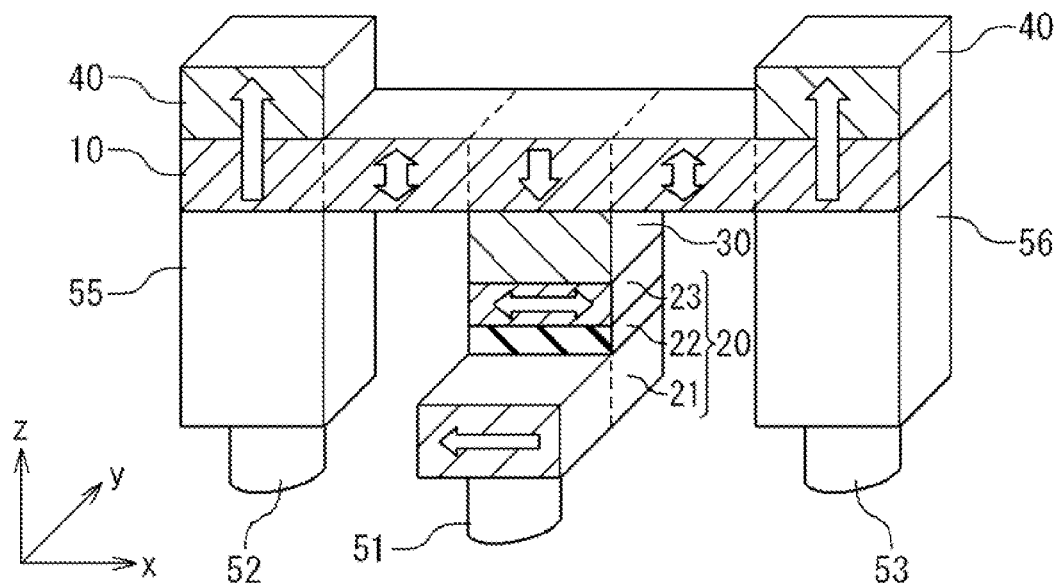
FIG. 32 is a perspective view showing a structural example of the magnetic memory element according to the embodiment of the present invention.
Figure 33:
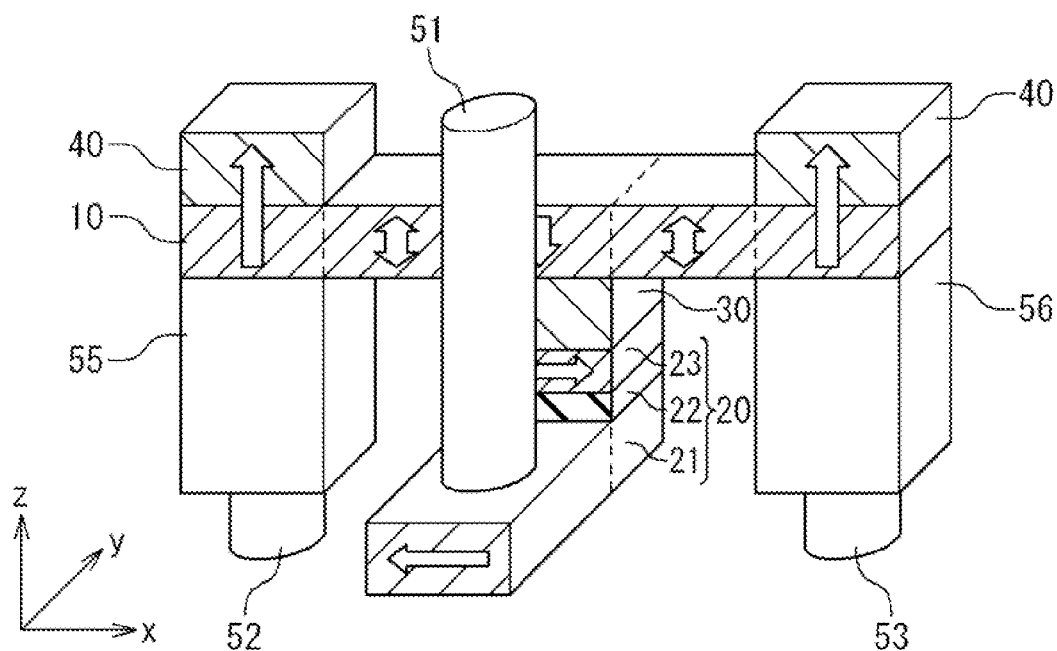
FIG. 33 is a perspective view showing a structural example of the magnetic memory element according to the embodiment of the present invention.
Figure 34:
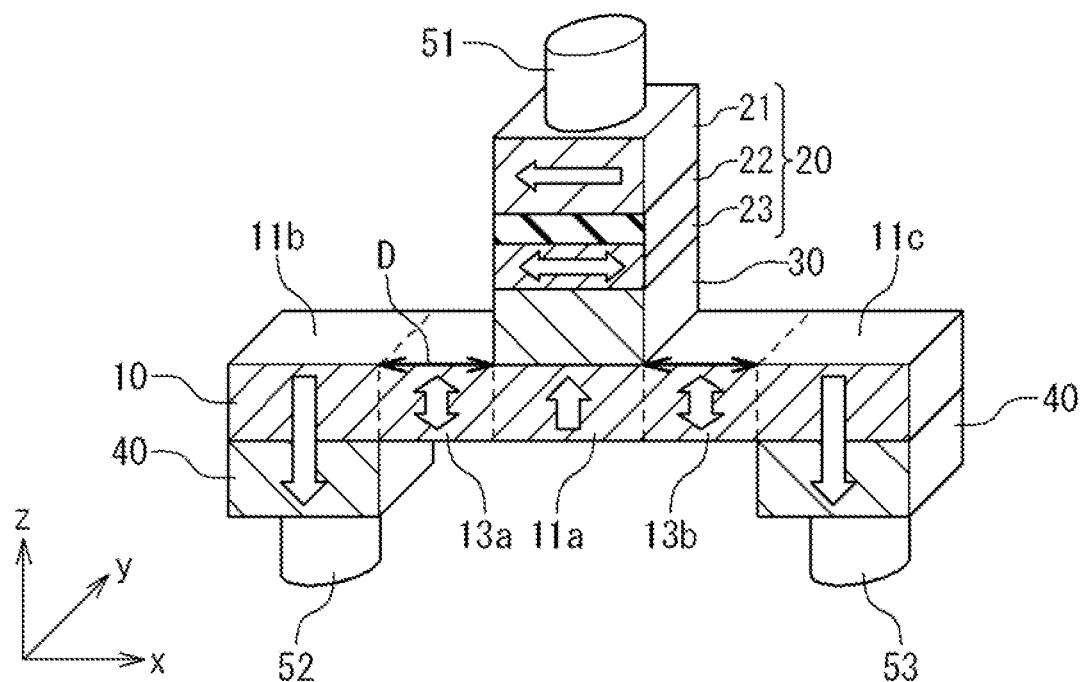
FIG. 34 is a perspective view showing a structural example of the magnetic memory element according to the embodiment of the present invention.

In addition, the variability of the resistance values of the reference cells 80r can be reduced, the necessary number of reference cells 80r can be decreased. Since the benefit of one column of the reference cells can be obtained, the array area can also be reduced. Further, since it is not required to provide the controller used for setting the reference cells 80r to the resistance value R0 and the reference value R1 in the Y side control circuit 93, the area of the peripheral circuit can be reduced. In addition, since it is not required to provide the process for setting the reference cells 80r to the resistance value R0 and the reference value R1, the manufacturing costs and the manufacturing time period can be reduced. Furthermore, since it is not required to provide the peripheral circuit and the program used for calculating the resistance value R0.5 from the resistance value R0 and. the reference value R1 of the reference cells 80r, the area of the peripheral circuit and the memory area of the program can be reduced. 13. The structure of magnetic memory element FIGS. 32 to 34 are perspective views showing structural examples of the magnetic memory element according to the embodiment of the present invention. As shown in FIGS. 32 to 34, the wiring lines 52, 55, 53, and 56 (to the first magnetization fixed area 11b and the second magnetization fixed area 11c) for the writing to the magnetization recording layer 10 are preferably connected to the magnetization recording layer 10 from the lower side. This is because the elements such as the MOS transistors TRa and TRb are placed in the lower side (semiconductor substrate side).

As shown in FIGS. 32 to 33, when the magnetic tunneling junction section 20 (MTJ) is arranged under the magnetization recording layer 10 (−z direction side), it is preferable that the connection portion between the reference layer 32 and the wiring line 51 does not overlap with the barrier layer 22. This is because the following troubles occur it the connection portion overlaps with the barrier layer 22. That is, since the step of the via of the wiring line 51 (see the description for FIGS. 19A to 19C) is reflected to the reference layer, defects occur in the barrier layer 22 on the reference layer 21 according to the step, thereby short-circuiting the reference layer 21 and the sensor layer 23.

As shown in FIG. 34, when the magnetic tunneling junction section 20 (MTJ) is arranged above the magnetization recording layer 10 (+z direction side), the column of the wiring line 51 and the magnetic tunneling junction section 20 is not adjacent to the column of the wiring line 52 and the hard layer 40 or the wiring line 53 and the hard layer 40. Therefore, the width D of the first domain wall moving area 13a or the second domain wall moving area 13b can be reduced to less than the design rule F. As a result, the high speed writing to the magnetic memory element can be achieved. In addition, by miniaturizing the size of the magnetic memory element, the size of the memory array can be reduced.

As described above, in the magnetic memory element using the current driven domain wall motion and having the magnetization recording layer with the perpendicular magnetic anisotropy the present invention, by providing two domain wall moving areas, three magnetization fixed area are provided, thereby enabling the magnetization of the magnetization fixed areas to be easily fixed. That is, the magnetization fixed areas can be easily formed. In addition, the boundaries between two domain wall moving areas and three magnetization fixed area can be used for the pinning sites of the domain walls. That is, the pinning sites of the domain walls can be easily formed.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The invention claimed is:

1. A magnetic memory element comprising:
   a magnetization recording layer configured to include a ferromagnetic layer with perpendicular magnetic anisotropy; and
   a magnetic tunneling junction section configured to be used for reading information in said magnetization recording layer,
   wherein said magnetization recording layer includes two domain wall moving areas,
   and wherein said magnetization recording layer includes:
   a first magnetization fixed area, a zero-th magnetization fixed area and a second magnetization fixed area, each configured to have magnetization which is fixed,
   a first domain wall moving area configured to be arranged between said first magnetization fixed area and said zero-th magnetization fixed area and have magnetization which enable to be switched, a domain wall being movable in said first domain wall moving area, and
   a second domain wall moving area configured to be arranged between said zero-th magnetization fixed area and said second magnetization fixed area and have magnetization which enable to be switched, a domain wall being movable in said second domain wall moving area.

2. The magnetic memory element according to claim 1, wherein said magnetic tunneling junction section includes:
   a sensor layer configured to include a ferromagnetic layer with in-plane magnetic anisotropy and have magnetization which enables to be switched.

3. The magnetic memory element according to claim 1, wherein said first magnetization fixed area and said second magnetization fixed area are substantially the same.

4. The magnetic memory element according to claim 3, wherein a magnetization direction of said first magnetization fixed area and a magnetization of said second magnetization fixed area are substantially the same, and
   a magnetization direction of said zero-th magnetization fixed area is opposite to said magnetization direction of said first magnetization fixed area and said magnetization of said second magnetization fixed area.

5. The magnetic memory element according to claim 3, wherein a projection of said sensor layer to said magnetization recording layer overlaps with at least a part of an area between said first domain wall moving area and said second domain wall moving area in said magnetization recording layer.

6. The magnetic memory element according to claim 5, wherein said magnetic tunneling junction section further includes:
   a reference layer configured to include a ferromagnetic layer with in-plane magnetic anisotropy and have magnetization which is fixed,
   wherein a magnetization direction of said reference layer is a direction of a straight line connecting said first domain wall moving area and said second domain wall moving area.

7. The magnetic memory element according to claim 5, further comprising:
   a contact layer configured to be provided between said zero-th magnetization fixed area and said magnetic tunneling junction section and have a conductive property.

8. The magnetic memory element according to claim 7, wherein said contact layer has a resistance value lower than that of said zero-th magnetization fixed area.

9. The magnetic memory element according to claim 7, wherein said contact layer includes magnetic material, and
   wherein a magnetization direction of said contact layer is fixed in a direction which is the same as said magnetization direction of said zero-th magnetization fixed area.

10. The magnetic memory element according to claim 3, wherein steps are provided at a boundary between said zero-th magnetization fixed area and the first domain wall moving area and at a boundary between said zero-th magnetization fixed area and second domain wall moving area.

11. The magnetic memory element according to claim 3, wherein a sectional area in a perpendicular direction of said zero-th magnetization fixed area is larger than a sectional area in a perpendicular direction of each of said first domain wall moving area and said second domain wall moving area.

12. The magnetic memory element according to claim 3, further comprising:
    first hard layers configured to be respectively provided near said first magnetization fixed area and said second magnetization fixed area, and fix a magnetization direction of said first magnetization fixed area and a magnetization direction of said second magnetization fixed area.

13. The magnetic memory element according to claim 12, further comprising:
    a second hard layer configured to be provided near said zero-th magnetization fixed area.

14. The magnetic memory element according to claim 12, wherein said magnetic tunneling junction section and said first hard layer, or, said magnetic tunneling junction section and said first and second hard layers are provided opposite to a substrate with respect to said magnetization recording layer.

15. A magnetic random access memory comprising:
    a plurality of magnetic memory cells configured to be arranged in a matrix shape, each of said plurality of magnetic memory cells including a first magnetic memory element,
    wherein said first magnetic memory element includes:
    a magnetization recording layer configured to include a ferromagnetic layer with perpendicular magnetic anisotropy, and
    a magnetic tunneling junction section configured to be used for reading information in said magnetization recording layer,
    wherein said magnetization recording layer includes two domain wall moving areas,
    and wherein said magnetization recording layer includes:
    a first magnetization fixed area, a zero-th magnetization fixed area and a second magnetization fixed area, each configured to have magnetization which is fixed,
    a first domain wall moving area configured to be arranged between said first magnetization fixed area and said zero-th magnetization fixed area and have magnetization which enable to be switched, a domain wall being movable in said first domain wall moving area, and
    a second domain wall moving area configured to be arranged between said zero-th magnetization fixed area and said second magnetization fixed area and have magnetization which enable to be switched, a domain wall being movable in said second domain wall moving area.

16. The magnetic random access memory according to claim 15, further comprising:
- a plurality of reference cells, each configured to include a magnetic memory element having the same structure as that of a second magnetic memory element, wherein said second magnetic memory element includes:
- another magnetization recording layer configured to include a ferromagnetic layer with perpendicular magnetic anisotropy, and
- another magnetic tunneling junction section configured to be used for reading information in said another magnetization recording layer, wherein said another magnetization recording layer includes two other domain wall moving areas, wherein said another magnetic tunneling junction section includes:
- a sensor layer configured to include a ferromagnetic layer with in-plane magnetic anisotropy and have magnetization which enables to be switched, wherein said sensor layer in said second magnetic memory element of each of said plurality of reference cells has a magnetic anisotropy in a direction perpendicular to a direction connecting between said two other domain wall moving.

17. The magnetic random access memory according to claim 15, wherein said magnetic tunneling junction section includes:
- a sensor layer configured to include a ferromagnetic layer with in-plane magnetic anisotropy and have magnetization which enables to be switched.

18. The magnetic random access memory according to claim 15, wherein a magnetization direction of said first magnetization fixed area and a magnetization of said second magnetization fixed area are substantially the same, and
- a magnetization direction of said zero-th magnetization fixed area is opposite to said magnetization direction of said first magnetization fixed area and said magnetization of said second magnetization fixed area.

* * * * *